United States Patent
Chih et al.

(10) Patent No.: US 10,504,515 B2
(45) Date of Patent: Dec. 10, 2019

(54) ROTATION AND TILTING OF A DISPLAY USING VOICE INFORMATION

(71) Applicant: Chiun Mai Communication Systems, Inc., New Taipei (TW)

(72) Inventors: Yu-Yang Chih, New Taipei (TW); Ming-Chun Ho, New Taipei (TW); Ming-Fu Tsai, New Taipei (TW); Cheng-Ping Liu, New Taipei (TW); Fu-Bin Wang, New Taipei (TW); Shih-Lun Lin, New Taipei (TW)

(73) Assignee: Chiun Mai Communication Systems, Inc., New Taipei (TW)

( * ) Notice: Subject to any disclaimer, the term of this patent is extended or adjusted under 35 U.S.C. 154(b) by 91 days.

(21) Appl. No.: 15/842,906

(22) Filed: Dec. 15, 2017

(65) Prior Publication Data

US 2018/0174584 A1     Jun. 21, 2018

Related U.S. Application Data

(60) Provisional application No. 62/435,088, filed on Dec. 16, 2016.

(51) Int. Cl.
*G10L 15/22* (2006.01)
*G10L 15/30* (2013.01)
(Continued)

(52) U.S. Cl.
CPC .............. *G10L 15/22* (2013.01); *G06F 3/167* (2013.01); *G10L 15/25* (2013.01); *G10L 15/30* (2013.01);
(Continued)

(58) Field of Classification Search
CPC ....... G10L 15/22; G10L 15/26; G10L 15/265; G10L 15/30; G06F 3/167; G06F 3/012; H04R 1/326
See application file for complete search history.

(56) References Cited

U.S. PATENT DOCUMENTS

2006/0119572 A1   6/2006   Lanier
2012/0036121 A1   2/2012   Jitkoff et al.
(Continued)

FOREIGN PATENT DOCUMENTS

CN       104102346 A     10/2014
CN       104951077 A      9/2015
(Continued)

OTHER PUBLICATIONS

Pingali G et al:"Steerable interfaces for pervasive computing spaces", PERCOM '03 Proceedings of the First IEEE Internatiinal Conference on Pervasive Computing and Communications, IEEE, US, Mar. 26, 2003(Mar. 26, 2003), pp. 315-322, XP032384610, DOI:10.1109/PERCOM.2003.1192755 ISBN:978-0-7695-1893-0.

*Primary Examiner* — Paras D Shah
(74) *Attorney, Agent, or Firm* — ScienBiziP, P.C.

(57) ABSTRACT

A voice control device includes a microphone module, a voice encoding module, a display and a processing unit. The voice encoding module is electrically connected to the microphone module. The processing unit is electrically connected to the voice encoding module and the display. The microphone module receives a voice signal and transmits the received voice signal to the voice encoding module. One of the voice encoding module and the processing unit analyzes and processes the voice signal to determine a sound source direction of the voice signal and obtains response information according to the voice signal. The processing unit controls the display to rotate to the sound source direction and transmits the response information to the display for displaying the response information.

24 Claims, 20 Drawing Sheets

(51) Int. Cl.
*G06F 3/16* (2006.01)
*H04R 1/32* (2006.01)
*G10L 15/25* (2013.01)
*G06K 9/00* (2006.01)
*H04N 5/232* (2006.01)

(52) U.S. Cl.
CPC ......... *H04R 1/326* (2013.01); *G06K 9/00255* (2013.01); *G06K 9/00268* (2013.01); *G10L 2015/223* (2013.01); *H04N 5/23203* (2013.01)

(56) References Cited

U.S. PATENT DOCUMENTS

| | | |
|---|---|---|
| 2012/0075166 A1 | 3/2012 | Marti et al. |
| 2013/0060571 A1 | 3/2013 | Soemo et al. |
| 2013/0094656 A1 | 4/2013 | Fung |
| 2013/0346078 A1 | 12/2013 | Gruenstein et al. |
| 2014/0009385 A1 | 1/2014 | Ku et al. |
| 2016/0100158 A1* | 4/2016 | Chen ........................ G09G 5/00 345/156 |
| 2016/0253146 A1 | 9/2016 | Yang et al. |
| 2016/0366531 A1 | 12/2016 | Popova |
| 2016/0379107 A1 | 12/2016 | Li et al. |
| 2017/0099555 A1* | 4/2017 | Singhvi ................ H04R 29/004 |
| 2017/0278477 A1* | 9/2017 | Jeong ................... F16M 11/128 |
| 2017/0278483 A1 | 9/2017 | Miyazawa et al. |

FOREIGN PATENT DOCUMENTS

| | | |
|---|---|---|
| JP | 2001236023 A | 8/2001 |
| JP | 2006324952 A | 11/2006 |
| TW | 200809768 A | 2/2008 |
| WO | 2016031224 A1 | 3/2016 |
| WO | 2017/164708 A1 | 9/2017 |

* cited by examiner

ROTATION AND TILTING OF A DISPLAY USING VOICE INFORMATION

CROSS-REFERENCE TO RELATED APPLICATIONS

This application claims priority to U.S. Patent Application No. 62/435,088 filed on Dec. 16, 2016, the contents of which are incorporated by reference herein.

FIELD

The present invention relates to a voice control device, a voice control system, and a method thereof.

BACKGROUND

With matures of voice recognition technology and artificial intelligence technology, now there are home-type and office-type intelligent voice assistant products existing on the market (for example, Amazon Echo or Google Home) to allow users to control electric equipments (for example, lights, door locks, thermostats, and/or fans) through a voice input way, query messages (for example, traffic messages, weather messages, etc.), perform tasks for calling a car, ordering a pizza, etc. However, these intelligent voice assistants can only provide information to the users through voice mode and cannot present image information or video information to the users through the voice mode. Furthermore, it is not suitable for these intelligent voice assistant products to provide the manifest information (such as a list of contact persons, a list of calendar, a list of programs, a list of agency matters, etc.) to the users directly through the voice mode.

BRIEF DESCRIPTION OF THE DRAWINGS

Many aspects of the disclosure can be better understood with reference to the following figures. The components in the figures are not necessarily drawn to scale, the emphasis instead being placed upon clearly illustrating the principles of the disclosure. Moreover, in the drawings, like reference numerals designate corresponding parts throughout several views.

DETAILED DESCRIPTION

Figure 1:
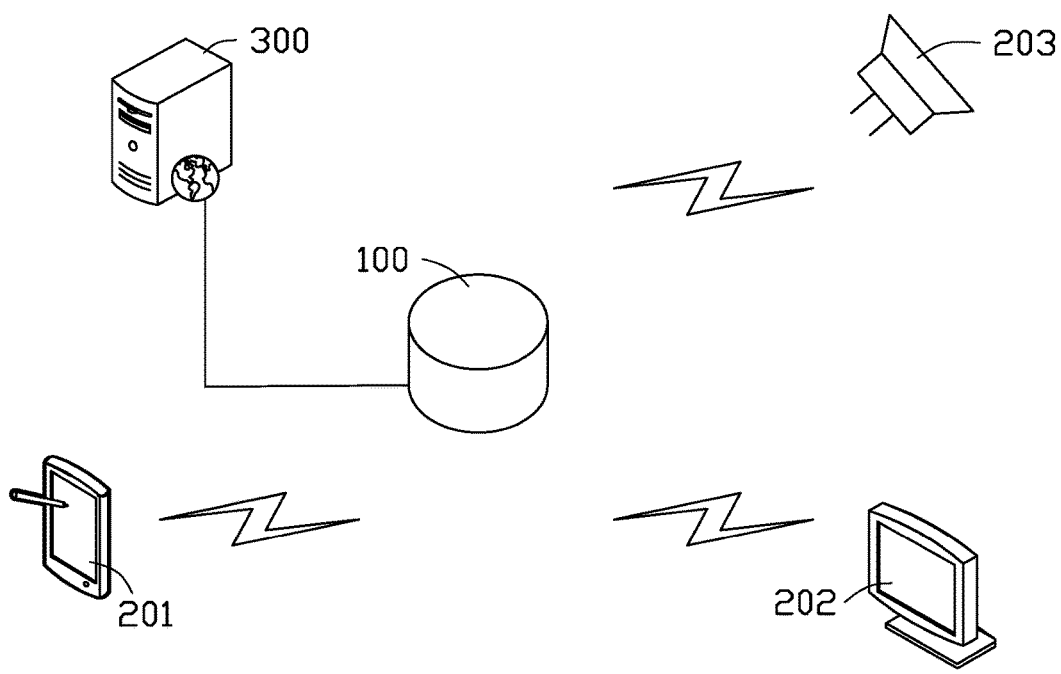
FIG. 1 is a system architecture diagram of a voice control system according to a first exemplary embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series and the like.

FIG. 1 illustrates a voice control system 500 according to a first exemplary embodiment. In this exemplary embodiment, the voice control system 500 includes a voice control device 100, a network server 300, and at least one remote electronic device.

The voice control device 100 is connected to an internet through a wired network, then exchanges data and instructions with the network server 300. In other exemplary embodiments, the voice control device 100 is further connected to the internet through a wireless communication standard (for example, a WLAN), a mobile communication standard (for example, WCDMA/CDMA2000/LTE), or other wireless communication protocols, and then exchanges data and instructions with the network server 300. The network server 300 may be a voice server.

In this exemplary embodiment, the voice control device 100 exchanges data or instructions with the at least one remote electronic device through a wireless communication module of the voice control device 100. In this exemplary embodiment, the at least one remote electronic device may be electronic devices having a display, for example, a mobile phone, a PDA, a tablet, a television, or a loudspeaker having a wireless communication function (for example, a Wi-Fi wireless loudspeaker, a Bluetooth loudspeaker). The at least one remote electronic device may be wirelessly connected to the voice control device 100 for receiving instructions or data from the voice control device 100, or for transmitting instructions or data to the voice control device 100.

Figure 2:
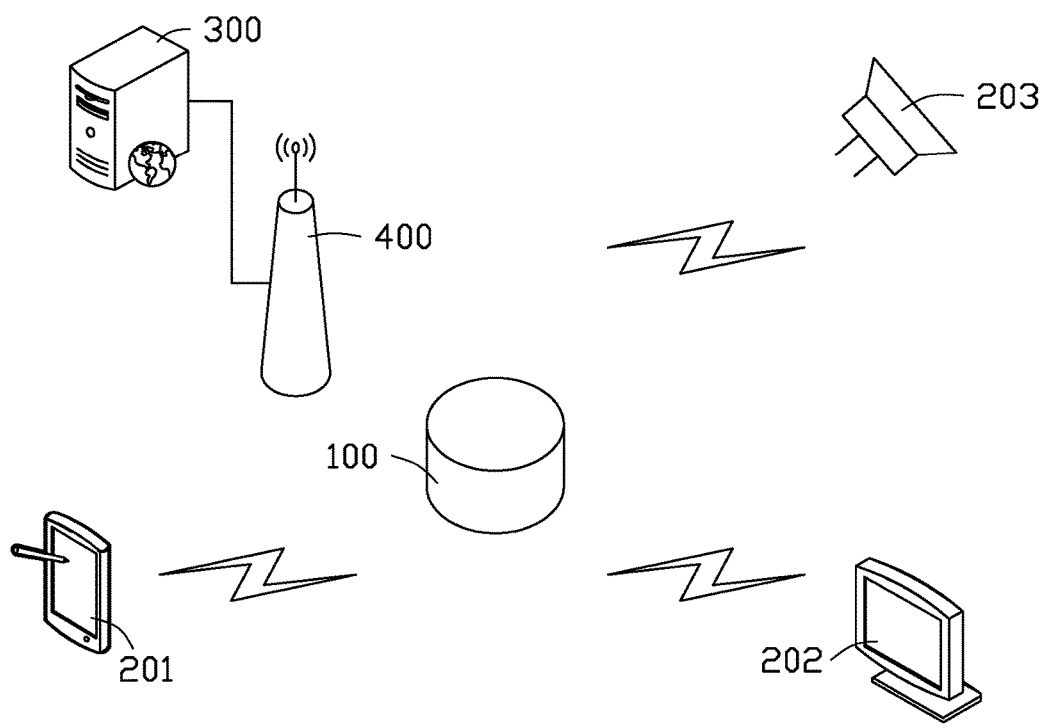
FIG. 2 is another system architecture diagram of the voice control system of FIG. 1.

As illustrated in FIG. 2, in other exemplary embodiments, the voice control system 500 further includes a wireless base station 400. The voice control device 100 may be connected, through a communication protocol, such as a WLAN (for example, Wi-Fi), to the wireless base station 400 performing a corresponding communication protocol. Then the voice control device 100 respectively exchanges data or instructions with the at least one remote electronic device through the wireless base station 400.

As illustrated in FIG. 1 and FIG. 2, in this exemplary embodiment, the voice control device 100 exchanges data and instructions with three remote electronic devices, for example, remote electronic devices 201, 202, 203. The remote electronic devices 201, 202 are electronic devices having a display. The remote electronic device 203 is a loudspeaker having a wireless communication function.

In this exemplary embodiments, the remote electronic devices 201, 202 include at least a wireless communication module, a loudspeaker and a display. The wireless communication module can transmit a power-on state or a power-off state of the remote electronic devices 201, 202 to the voice control device 100, so that the voice control device 100 can immediately record the power-on state or the power-off state of the remote electronic devices 201, 202.

Figure 3:
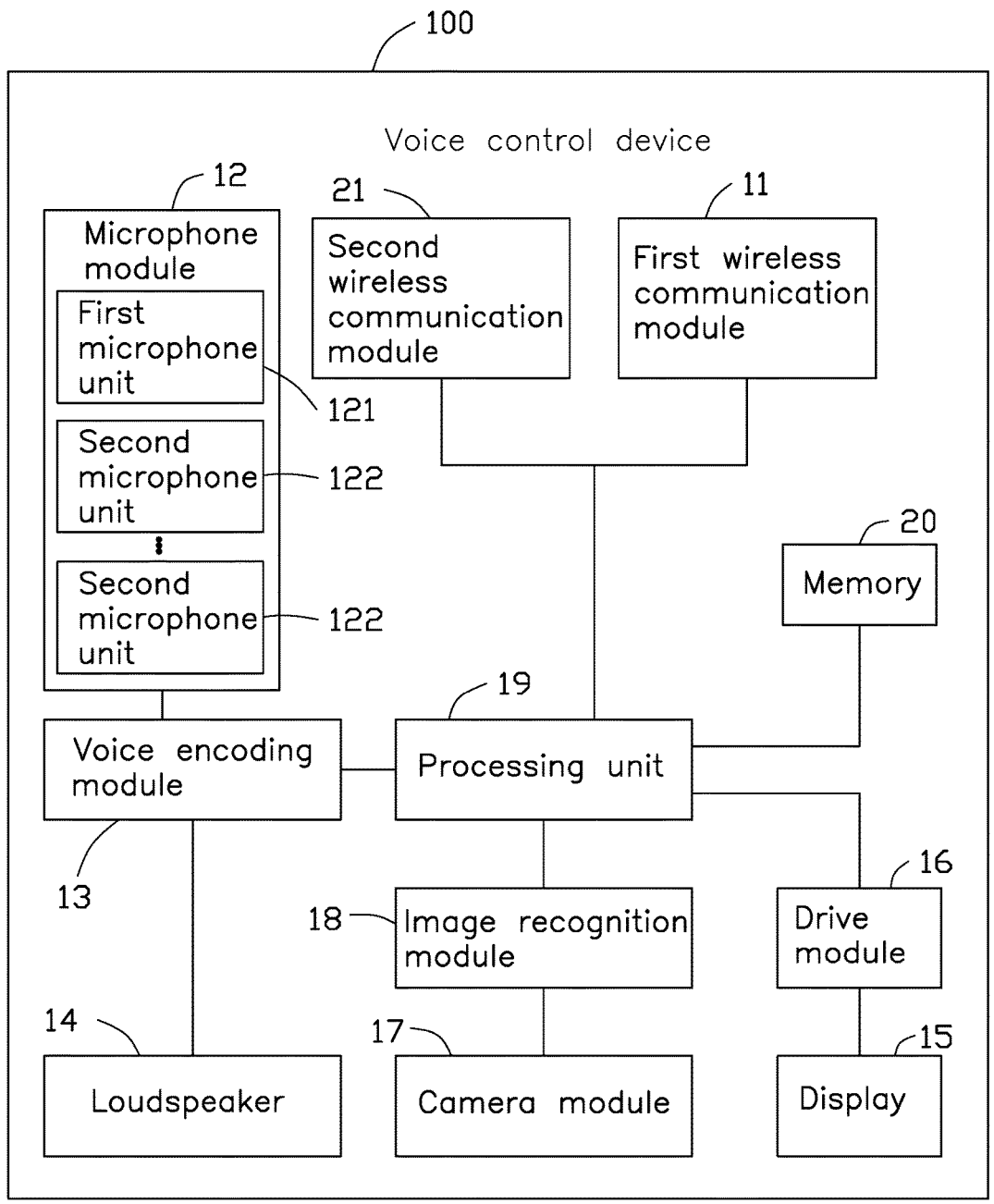
FIG. 3 is a block diagram of a voice control device of the voice control system of FIG. 1.

As illustrated in FIG. 3, the voice control device 100 includes a first wireless communication module 11, a microphone module 12, a voice encoding module 13, a loudspeaker 14, a display 15, a drive module 16, a camera module 17, an image recognition module 18, a processing unit 19, a memory 20, and a second wireless communication module 21. The processing unit 19 may be achieved by a processor or any calculation circuit having a calculation capability.

The first wireless communication module 11 is electrically connected to the processing unit 19 for transmitting and receiving wireless communication signals. The voice control device 100 transmits relevant information (for example, text, voice, image, or video) to the internet through the first wireless communication module 11, or receives the relevant information from the internet. The first wireless communication module 11 may be Wi-Fi, 3G (WCDMA, CDMA2000, or TD-SCDMA), 4G (LTE, LTE-advanced) of the mobile communication standard, or any wireless communication protocol module capable of transmitting data.

In other exemplary embodiments, the first wireless communication module 11 may be WiGi, Bluetooth, Zigbee, or other short distance communication protocol module. In other exemplary embodiments, the first wireless communication module 11 may be served as a wireless base station of a wireless communication protocol (for example, WiFi). The first wireless communication module 11 then directly provides a wirelessly connection for the remote electronic devices 201, 202, 203 and exchanges data or instructions.

The microphone module 12 includes a plurality of microphone units. In this exemplary embodiment, the microphone module 12 includes a first microphone unit 121 and a plurality of second microphone units 122, for example, six second microphone units 122. In other exemplary embodiments, the number of the second microphone units 122 is not limited to be six and may be designed according to user's requirements. The first microphone unit 121 and the second microphone units 122 are all used to receive voice signals.

The voice encoding module 13 is electrically connected to the microphone module 12, the loudspeaker 14 and the processing unit 19. The voice encoding module 13 converts an analog voice signal received by the microphone module 12 into a digital voice signal and transmits the digital voice signal to the processing unit 19.

For example, when the voice control device 100 is in a standby mode, the first microphone unit 121 is activated to receive a voice signal while the second microphone units 122 are in a deactivated state. When the voice control device 100 is in the standby mode and the first microphone unit 121 receives a voice signal, the first microphone unit 121 transmits the voice signal to the voice encoding module 13. The voice encoding module 13 converts the voice signal, which is analog, into a digital voice signal and transmits the digital voice signal to the processing unit 19. The processing unit 19 analyzes the digital voice signal and determines whether the voice signal received by the first microphone unit 121 is a predetermined voice starting instruction, for example, [hello].

When the processing unit 19 determines the voice signal is the predetermined voice starting instruction, the processing unit 19 transmits a starting signal to the second microphone units 122, so that the second microphone units 122 are activated to receive a subsequent voice signal and transmit the subsequent voice signal to the processing unit 19.

In this exemplary embodiment, the predetermined voice starting instruction may be [Hello] or other voice starting instructions predefined by the user.

When the processing unit 19 analyzes and determines the voice signal received from the second microphone units 122 is a voice request instruction, the voice control device 100 further transmits the voice request instruction to a voice database of the network server 300 to search a corresponding response information from the voice database. The corresponding response information from the voice database is further returned to the voice control device 100.

In this exemplary embodiment, the voice request instructions may include at least, but not limited to, two types, for example, a control-type voice instruction, an instruction-type voice instruction and a question-type voice instruction. The control-type voice instruction includes, for example, [turn on the TV], [adjust the volume], [open the music player], [play music], and various instructions for controlling the remote electronic devices 201, 202, 203. The instruction-type voice instruction includes, for example, [ordering pizza], [booking tickets], [booking hotels], and other booking instructions. The question-type voice instructions includes, for example, [how is the weather today in Taipei], [which movies are there today], [which games are there today], and other question-type instructions.

In other exemplary embodiments, when the processing unit 19 analyzes and determines the voice signal received from the second microphone units 122 is a control instruction, the voice control device 100 transmits the control instruction to one of the corresponding remote electronic devices 201, 202, 203. For example, the control instruction may be a turn-on control instruction for turning on at least one of the remote electronic devices 201, 202, 203, such as turning on a television.

In other exemplary embodiments, when the second microphone units 122 transmit the voice signal to the processing unit 19, the processing unit 19 further executes a voice algorithm or a voiceprint comparison algorithm according to the received voice signal, thereby determining and recognizing a sound source direction of the voice signal, a sound source distance, and/or an identity of the user.

In this exemplary embodiment, the voice encoding module 13 further converts the voice signal obtained by the processing unit 19 from a voice database into an analog voice signal and transmits the analog voice signal to the loudspeaker 14 to output. For example, the voice encoding module 13 converts corresponding information into an analog voice signal and transmits the analog voice signal to the loudspeaker 14 to output. The corresponding information is received by the processing unit 19 from the voice database of the network server 300 through a wired network or the first wireless communication module 11. In other exemplary embodiments, the corresponding information may also be pre-stored in the memory 20. The voice encoding module 13 may also convert the corresponding information found by the processing unit 19 in the memory 20 into an analog voice signal and transmits the analog voice signal to the loudspeaker 14 to output.

In other exemplary embodiments, the voice encoding module 13 can also include a microprocessor and an independent memory (not shown). The independent memory may store a simple keyword library. According to the keyword library of the independent memory, the microprocessor of the voice encoding module 13 can directly determine whether the voice signal received by the microphone module 12 is a predetermined voice starting instruction or a control instruction. Through a pre-processing of the voice encoding module 13, the voice signal received by the microphone module 12 can be directly transmitted to the voice encoding module 13 and needs not to be transmitted to the processing unit 19 for processing, then power consumption and the arithmetic efficiency can be saved.

In this exemplary embodiment, the voice control device 100 includes at least one loudspeaker 14. For example, the voice control device 100 includes a plurality of loudspeaker 14. The loudspeakers 14 are respectively positioned at a periphery of the voice control device 100. For example, the voice control device 100 includes two loudspeakers 14 positioned in opposite directions. For example, the voice control device 100 includes one loudspeaker 14 positioned towards a bottom direction of the voice control device 100. The sound generated by the loudspeaker 14 is outputted through the through holes around the periphery of voice control device 100.

As illustrated in FIG. 5 to FIG. 8, in this exemplary embodiment, one end of the display 15 is positioned on the voice control device 100 through a connecting structure 151, for example, a hinge. The display 15 displays the information obtained by the processing unit 19 from the network server 300 or the memory 20.

The drive module 16 is positioned inside the voice control device 100. The drive module 16 controls the display 15 to rotate within a specific angle and changes a tilting angle of the display 15, so as to adjust a display direction of the display 15.

The camera module 17 is positioned on the display 15 or is positioned on the same side wall, on which the display 15 is positioned, of the voice control device 100.

The image recognition module 18 is electrically connected to the camera module 17 and the processing unit 19. The image recognition module 18 receives an image captured by the camera module 17 and recognizes an object or an object location in the captured image. When the image recognition module 18 recognizes the object or the object location, the image recognition module 18 generates a location information signal corresponding to the object or the object location and transmits the location information signal to the processing unit 19. The processing unit 19 performs a corresponding function according to the location information signal. For example, the processing unit 19 can control the drive module 16 to adjust a display position of the display 15 according to the location information signal.

In one exemplary embodiment, the image recognition module 18 may determine whether there is a face feature of an user existing in an image captured by the camera module 17. When there is a face feature existing in the captured image, the image recognition module 18 determines that the user's face is present in the captured image. In another exemplary embodiment, the image recognition module 18 may also identify a plurality of face features from the image captured by the camera module 17 and simultaneously obtain locations of the plurality of face features in the captured image. In another exemplary embodiment, after the image recognition module 18 attempts a preset number of times to identify a face feature, if the image recognition module 18 still cannot identify any of the face features from the image captured by the camera module 17, the image recognition module 18 returns a signal corresponding to no face feature to the processing unit 19.

In this exemplary embodiment, when the image recognition module 18 determines that there is user's face features existing in the captured image, the image recognition module 18 further determines whether the user's face location is at a preset position of the captured image. The preset position can be determined by a relative position between the camera module 17 and the display 15.

For example, when the camera module 17 is positioned on a frame of a periphery of the display 15 adjacent to a center line position of the display 15, the preset position may be a middle position of the captured image. Accordingly, when the image recognition module 18 determines that the position of the user's face is not at the middle position of the captured image, the image recognition module 18 transmits a location information signal representing the face location to the processing unit 19. The processing unit 19 then drives the drive module 16 according to the location information signal to adjust a display direction of the display 15, so that the display 15 can be accurately oriented towards a viewing location of the user.

When the image recognition module 18 determines that there are a plurality of face features existing in the captured image, the image recognition module 18 calculates a center position according to the locations of the plurality of face features. For example, when the image recognition module 18 recognizes that there are three faces existing in the captured image, the face positioned at the middle is identified as the center position and a location information signal representing the center position is transmitted to the processing unit 19. The processing unit 19 then drives the drive module 16 according to the location information signal to adjust the display direction of the display 15, so that the display 15 can be accurately oriented towards an optimum location that can be viewed by a plurality of users.

In this exemplary embodiment, the image recognition module 18 determines whether the user's image exists in the captured image through the face feature. In other exemplary embodiments, the image recognition module 18 can determine whether the user's image exists in the captured image through other methods, for example, human gestures, body movements, etc.

In other exemplary embodiments, the image recognition module 18 may be integrated into the processing unit 19, or may be achieved by software and executed by the processing unit 19.

The processing unit 19 is electrically connected to the first wireless communication module 11, the voice encoding module 13, the display 15, the drive module 16, the image recognition module 18, the memory 20 and the second wireless communication module 21.

When the processing unit 19 receives the digital voice signal from the voice encoding module 13, the processing unit 19 transmits the digital voice signal to the network server 300 through the first wireless communication module 11 for voice analysis and identification. After analyzing and identifying the digital voice signal, the network server 300 finds a corresponding response information (for example, text form, image form, or voice form) from a voice analysis program and/or the voice database of the network server 300. The network server 300 further transmits the response information to the voice control device 100. The processing unit 19 receives the response information through the first wireless communication module 11, generates a voice response signal according to the response information, and transmits the voice response signal to the voice encoding module 13 for driving the loudspeaker 14 to play the voice response signal. Alternatively, the processing unit 19 generates a text message or an image message according to the response information, and transmits the text message or the image message to the display 15, thereby displaying the text message or the image message.

In another exemplary embodiment, after the processing unit 19 receives the digital voice signal from the voice encoding module 13, the processing unit 19 analyzes and identifies the digital voice signal through a voice analysis program executed by the processing unit 19. After analyzing and identifying the digital voice signal, the processing unit 19 finds a corresponding response information (for example, text, image, or voice) from a voice database stored in the memory 20. Similarly, the processing unit 19 generates a voice response signal according to the response information, and transmits the voice response signal to the voice encoding module 13, thereby driving the loudspeaker 14 to play the voice response signal. Alternatively, the processing unit 19 generates a text message or an image message according to the response information, and transmits the text message or the image message to the display 15, thereby displaying the text message or the image message.

In this exemplary embodiment, when the processing unit 19 analyzes and identifies the digital voice signal as a control instruction, the processing unit 19 executes a specific function according to the control instruction. For example, if the digital voice signal is identified as a control instruction indicating [turn on the television], the processing unit 19 generates a control signal and wirelessly transmits the control signal to the television for turning on the television.

Figure 4:
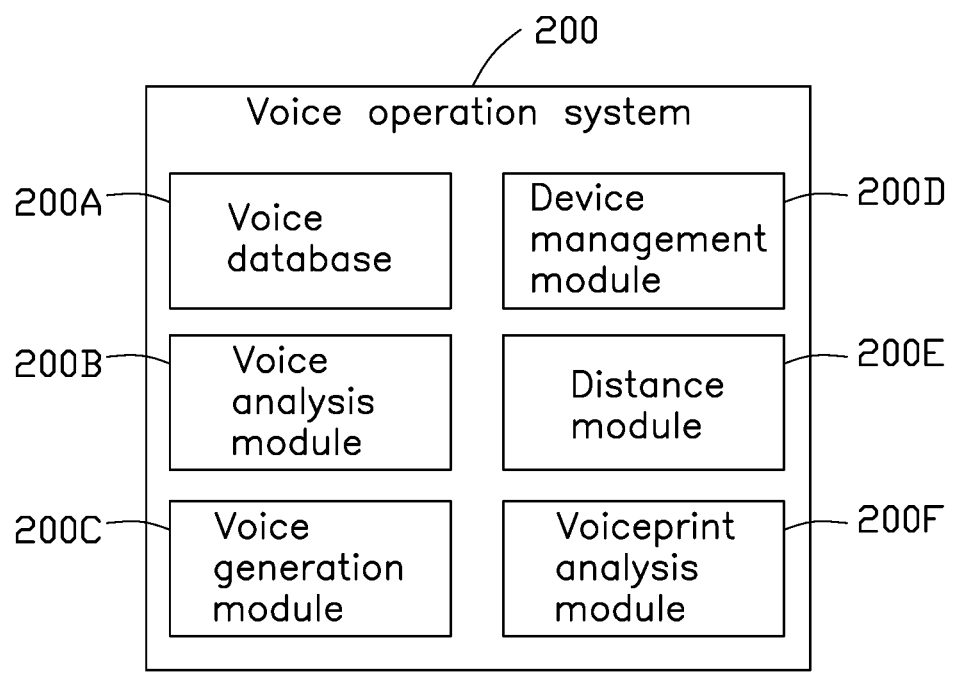
FIG. 4 is a block diagram of a voice operation system of the voice control device of FIG. 1.
Figure 5:
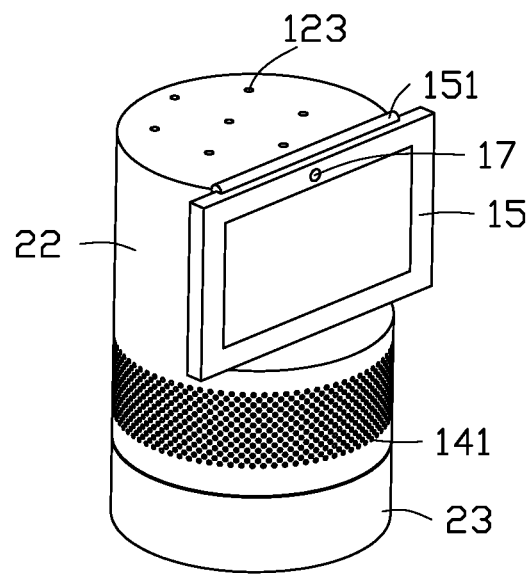
FIG. 5 to FIG. 8 are schematic views of the voice control device of FIG. 1.
Figure 6:
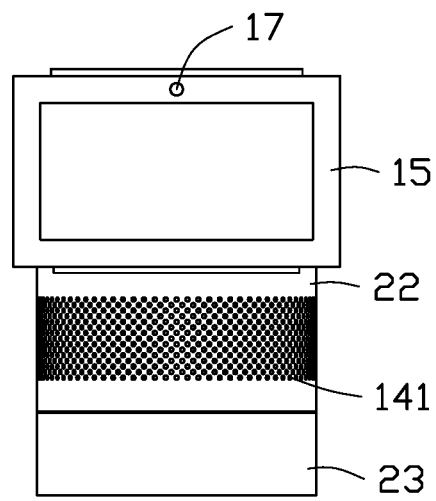
Figure 7:
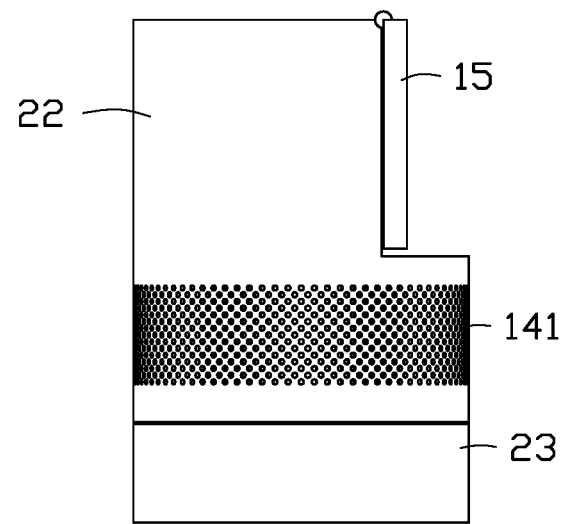
Figure 8:
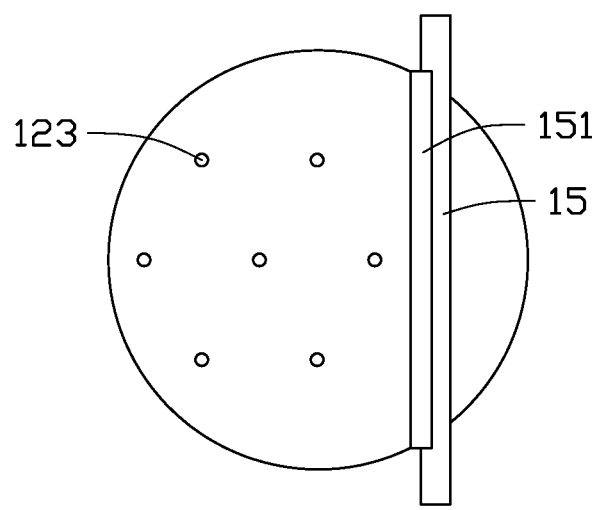

As illustrated in FIG. 3 and FIG. 4, the memory 20 is electrically connected to the processing unit 19. The memory 20 stores an operation system of the voice control device 100, related function modules of a voice operation system 200 running in the voice control device 100, user's data, and various parameters of the voice control device 100. Program codes of the relevant function modules of the voice operation system 200 are all stored in the memory 20 and are executed by the processing unit 19.

In this exemplary embodiment, the voice operation system 200 at least includes a voice database 200A, a voice analysis module 200B, a voice generation module 200C, a device management module 200D, a distance module 200E, and a voiceprint analysis module 200F. The above function modules are program codes corresponding to various functions and are stored in the memory 20. When the voice control device 100 performs various functions, the processing unit 19 loads corresponding program codes from the memory 20 and executes corresponding functions.

The voice database 200A is a language and sound database. The voice database 200A includes voice information of pre-established letters, words, and sentences. These voice information may be in text form or voice form, and may be presented through Chinese, English, Japanese, or any other languages.

In other exemplary embodiments, the voice database 200A may be replaced by or include an image database (not shown). The image database includes image information of pre-established patterns, photos, and videos.

The voice analysis module 200B analyzes the voice signal received by the microphone module 12. In detail, the voice analysis module 200B samples the voice signal, quantizes and converts the voice signal into digital voice data, and then processes the voice data, thereby obtaining voice feature information of the content pronunciation of the voice signal. For example, when the user asks [What day is today], the microphone module 12 receives the voice signal of the [What day is today] and transmits the voice signal to the voice encoding module 13. Next, the voice encoding module 13 transmits the voice signal to the processing unit 19. The voice signal is then analyzed by the voice analysis module 200B of the processing unit 19. The voice analysis module 200B may recognize [What day is today] from the received voice signal and find a corresponding response information, such as [Today is Friday], from the voice database 200A.

In another exemplary embodiment, the voice analysis module 200B may recognize [What day is today] from the received voice signal and find a corresponding response information, such as an icon or image presenting [Friday], from the image database.

In other exemplary embodiments, the voice analysis module 200B may analyze and extract voice feature information of the voice signal, transmits the voice feature information to the network server 300 through the first wireless communication module 11 for matching, thereby obtaining a corresponding response information, such as [Today is Friday] or an icon or image presenting [Friday].

The voice generation module 200C converts the response information (for example, [Today is Friday] or the icon or image presenting [Friday]) obtained by the voice database 200A, the image database, or the network server 300 into a corresponding voice signal or an image signal. The processing unit 19 transmits the corresponding voice signal to the loudspeaker 14 through the voice encoding module 13, and finally the loudspeaker 14 generates a voice of [Today is Friday] to respond to the user. Alternatively, the processing unit 19 transmits the corresponding image signal to the display 15 to be displayed so as to respond to the user.

The device management module 200D manages the remote electronic devices 201, 202, 203 connected to the voice control device 100. In this exemplary embodiment, the voice control device 100 further includes the second wireless communication module 21 for controlling the remote electronic devices 201, 202, 203 through a wireless communication protocol. In this exemplary embodiment, the wireless communication protocol may be Wi-Fi, Bluetooth, WiGig, D2D (Device to Device), or infrared. In other exemplary embodiments, any other protocols that can transmit wireless data may be implemented in this exemplary example to achieve the same purpose.

In this exemplary embodiment, the device management module 200D can record power-on states, device types, whether a display is included, whether a loudspeaker is included, and/or other functions of the remote electronic devices 201, 202, 203. With the above-mentioned records, the voice control device 100 can determine whether to transmit the above-described response information (for example, the voice signal or the image signal) to the remote electronic devices 201, 202, 203 through the second wireless communication module 21 for outputting the response information through the remote electronic devices 201, 202, 203.

The distance module 200E may be configured to calculate a distance between the remote electronic devices 201, 202, 203 and the voice control device 100. In one exemplary embodiment, the distance module 200E may estimate the distance between the remote electronic devices 201, 202, 203 and the voice control device 100 through wireless signal strength, such as a RSSI value, between the second wireless communication module 21 and the remote electronic devices 201, 202, 203.

In another exemplary embodiment, the distance module 200E may estimate the distance between the user and the voice control device 100 according to a focus distance value of the user in the image captured by the camera module 17. In another exemplary embodiment, the distance module 200E may measure the distance between the user and the voice control device 100 by using a laser-ranging module (not shown). In another exemplary embodiment, the distance module 200E may measure the distance between the user and the voice control device 100 by using an ultrasonic module (not shown).

In other exemplary embodiments, the distance module 200E may achieve the same purpose through any other modules or methods of measuring distance, and is not limited to the above-described modules and methods. According to the distance between the user and the voice control device 100 and/or power-on states of the remote electronic devices 201, 202, 203, the voice control device 100 can determine whether to transmit the response information (for example, the voice signal or the image signal) to the remote electronic devices 201, 202, 203 through the second wireless communication module 21 for outputting the response information through the remote electronic devices 201, 202, 203. Alternatively, the voice control device 100 can determine whether to output the response information directly through the loudspeaker 14 or the display 15 of the voice control device 100.

The voiceprint analysis module 200F is configured to analyze the voice signal received from the microphone module 12 and processed by the voice encoding module 13. The voiceprint analysis module 200F further determines whether the voice signal is coincided with a predetermined user's voiceprint, thereby determining an identity of the user.

In this exemplary embodiment, the processing unit 19 may adjust a sound output volume of the loudspeaker 14 of the voice control device 100 according to a sound source distance (i.e., the distance between the user and the voice control device 100).

For example, in one exemplary embodiment, when the sound source distance is greater than a predetermined value, e.g., five meters, the sound output volume of the loudspeaker 14 is increased, so that the user who is five meters away from the voice control device 100 can hear the sound generated by the loudspeaker 14.

In another exemplary embodiment, when the sound source distance is greater than a predetermined value, e.g., five meters, the voice control device 100 transmits through the second wireless communication module 21 the voice signal corresponding to the response information to at least one of the remote electronic devices 201, 202, 203, which is recorded by the device management module 200D as one having a loudspeaker and being in a power-on state, for playing.

As illustrated in FIG. 5 to FIG. 8, the voice control device 100 includes an upper housing 22 and a lower housing 23. In this exemplary embodiment, the display 15 is positioned on a side wall of an upper half section of the upper housing 22. A plurality of loudspeaker through holes 141 are defined around a lower half section of the upper housing 23 for outputting the sound generated by the at least one loudspeaker 14 (shown in FIG. 3) positioned inside the upper housing 22. Since the loudspeaker through holes 141 are defined around the upper housing 22, the sound outputted by the loudspeaker 14 can be transmitted to each direction of the environment.

In this exemplary embodiment, a plurality of microphone through holes 123 are defined on a top plane of the upper housing 22. One of the microphone through holes 123 is positioned near a center of the top plane of the voice control device 100 and corresponds to the first microphone unit 121 shown in FIG. 3. Other microphone through holes 123 are evenly positioned around the center microphone through hole 123. For example, other microphone through holes 123 are evenly positioned around the center microphone through hole 123 at an angular interval of 60 degrees and correspond to the second microphone units 122 shown in FIG. 3, so as to form an array of microphone through holes.

The first microphone unit 121 and the plurality of second microphone units 122 of the microphone module 12 shown in FIG. 3 are all positioned inside the upper housing 22 for respectively receiving the voice signal through the plurality of microphone through holes 123.

As illustrated in FIG. 9 to FIG. 13, the drive module 16 includes a rotation drive unit 161 and a tilting drive unit 162. The rotation drive unit 161 is configured to rotate the display 15 relative to the lower housing 23, so as to turn the display 15 to the user who makes the voice. The tilting drive unit 162 is configured to change a tilting angle of the display 15 relative to the upper housing 22, so as to adjust a display direction of the display 15, and the information displayed on the display 15 can be directed towards the user for the user to watch.

Figure 9:
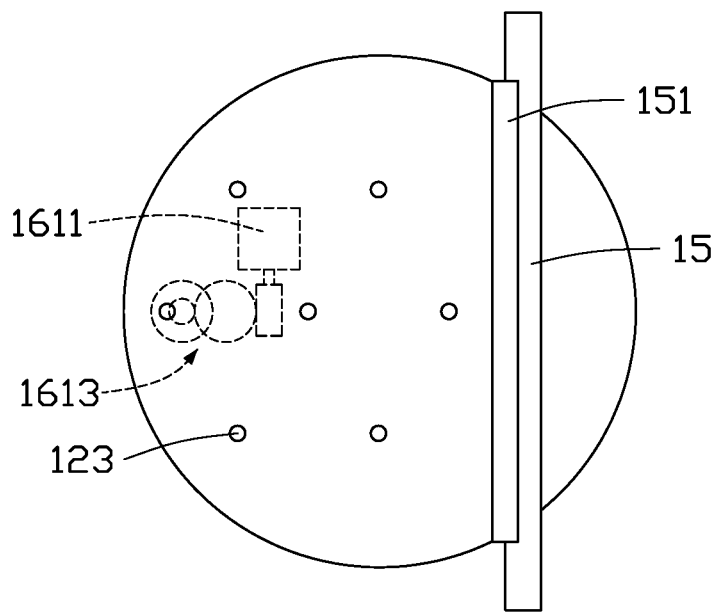
FIG. 9 to FIG. 11 are schematic views of a rotation drive unit of the voice control device of FIG. 1.
Figure 10:
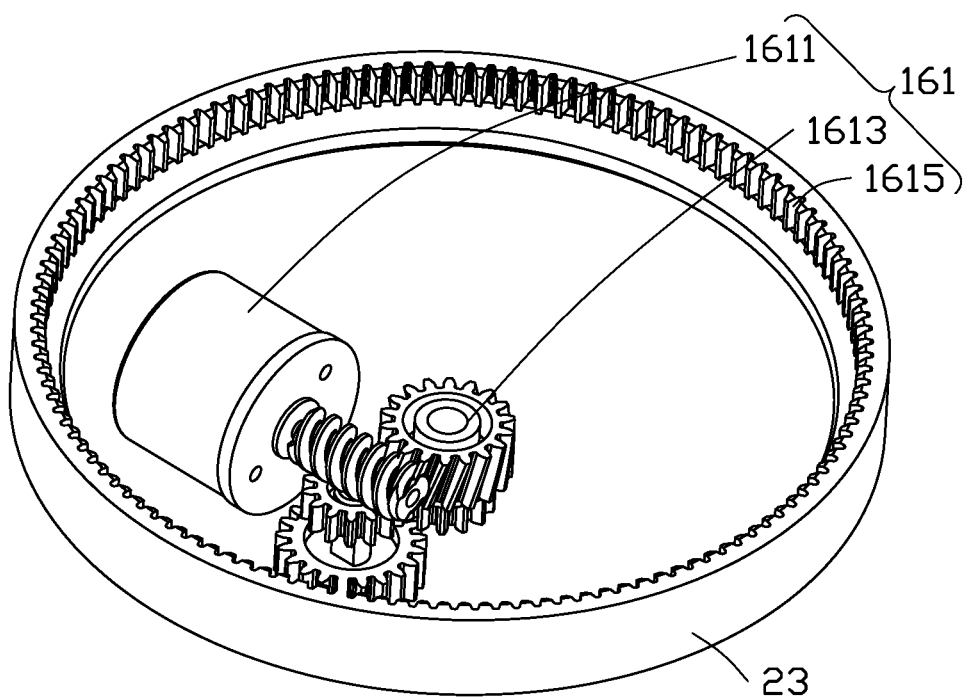
Figure 11:
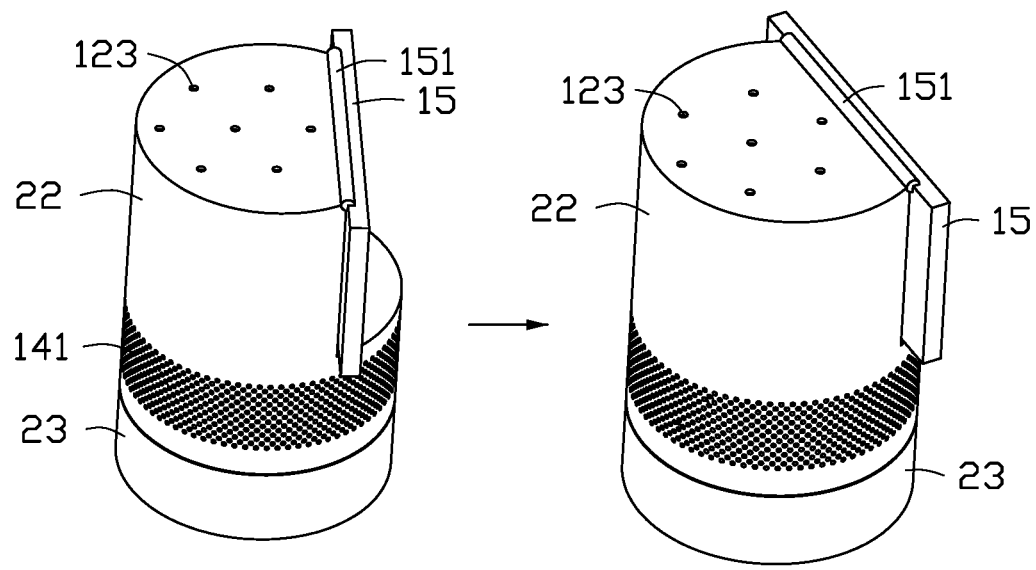

As illustrated in FIG. 9 to FIG. 11, in this exemplary embodiment, the rotation drive unit 161 is positioned inside the lower housing 23 for controlling a relative rotation between the upper housing 22 and the lower housing 23. The rotation drive unit 161 includes a first motor 1611, a first gear set 1613 and a first gear track 1615. The first motor 1611, the first gear set 1613 and the first gear track 1615 are connected to one another. The first motor 1611, the first gear set 1613, and the first gear track 1615 are all positioned inside the lower housing 23. In this exemplary embodiment, the first gear set 1613 is formed by at least one gear connected between the first motor 1611 and the first gear track 1615. The first gear set 1613 can also be formed by a plurality of gears with different sizes, different numbers of teeth and shapes.

The first gear track 1615 is substantially annular and is positioned on an inner wall of the lower housing 23. The first motor 1611 is electrically connected to the processing unit 19 through a driving circuit (not shown). When the first motor 1611 is activated by the processing unit 19, the first motor 1611 drives the first gear set 1613 to rotate, and then the first gear set 1613 drives the first gear track 1615 to rotate, thereby making a relative rotation between the upper housing 22 and the lower housing 23 (as shown in FIG. 11).

In other exemplary embodiments, the first motor 1611 and the first gear set 1613 may also be positioned in the lower housing 23, and the first gear track 1615 is positioned on an inner wall of the upper housing 22, so as to generate a corresponding rotational movement between the upper housing 22 and the lower housing 23.

Figure 12:
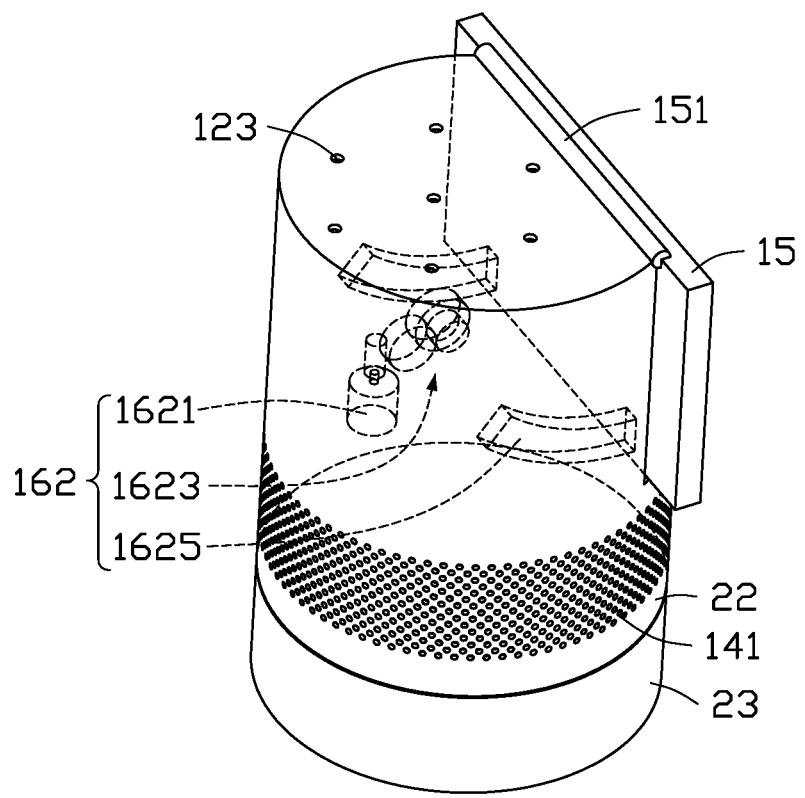
FIG. 12 to FIG. 13 are schematic views of a tilting drive unit of the voice control device of FIG. 1.
Figure 13:
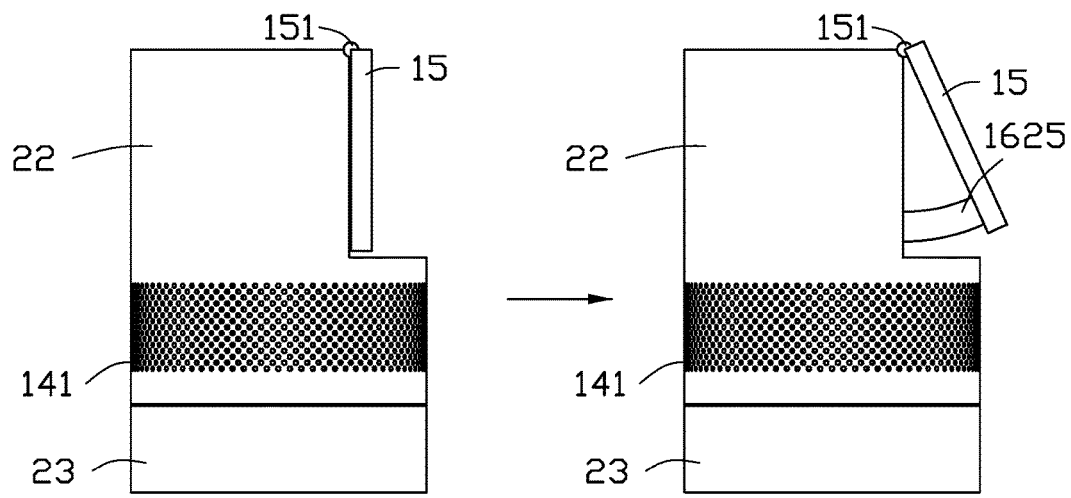

As illustrated in FIG. 12 and FIG. 13, in this exemplary embodiment, the tilting drive unit 162 is positioned inside the upper housing 22. The tilting drive unit 162 includes a second motor 1621, a second gear set 1623, and a gear rail 1625. In this exemplary embodiment, the second gear set 1623 is formed by at least one gear connected between the second motor 1621 and the gear rail 1625. The second gear set 1623 can also be formed by a plurality of gears with different sizes, different numbers of teeth and shapes. One end of the gear rail 1625 is coupled to an end of the display 15 away from the connecting structure 151. Another end of the gear rail 1625 is coupled to the second gear set 1623 and then is coupled to the second motor 1621 through the second gear set 1623. The second gear set 1623 transmits a torque outputted by the second motor 1621 to the gear rail 1625. The second motor 1621 is electrically connected to the processing unit 19 through a driving circuit (not shown).

When the second motor 1621 is activated by the processing unit 19, the second motor 1621 drives the second gear set 1623 to rotate and then drives the gear rail 1625 to rotate, thereby pushing the display 15 for adjusting the tilting angle of the display 15. For example, as illustrated in FIG. 13, when the second motor 1621 is activated, the second motor 1621 drives the gear rail 1625 through the second gear set 1623 to push the display 15 away from the upper housing 22, or pull the display 15 back inwardly to the upper housing 22. Accordingly, the tilting angle of the display 15 can be changed according to a viewing angle of the user, so that the display 15 is tilted at a suitable angle for the user to watch.

Figure 14:
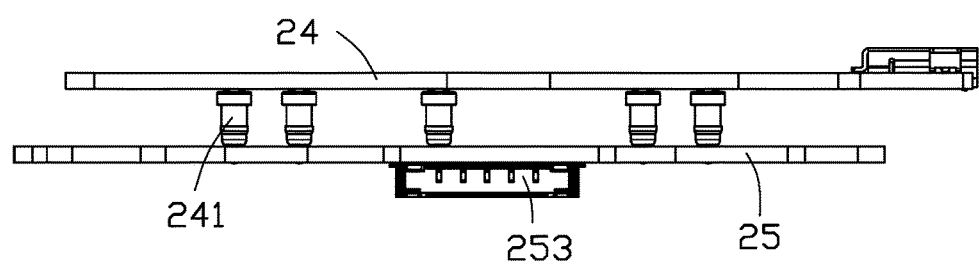
FIG. 14 to FIG. 16 are schematic views of a first circuit board and a second circuit board of the voice control device of FIG. 1.
Figure 15:
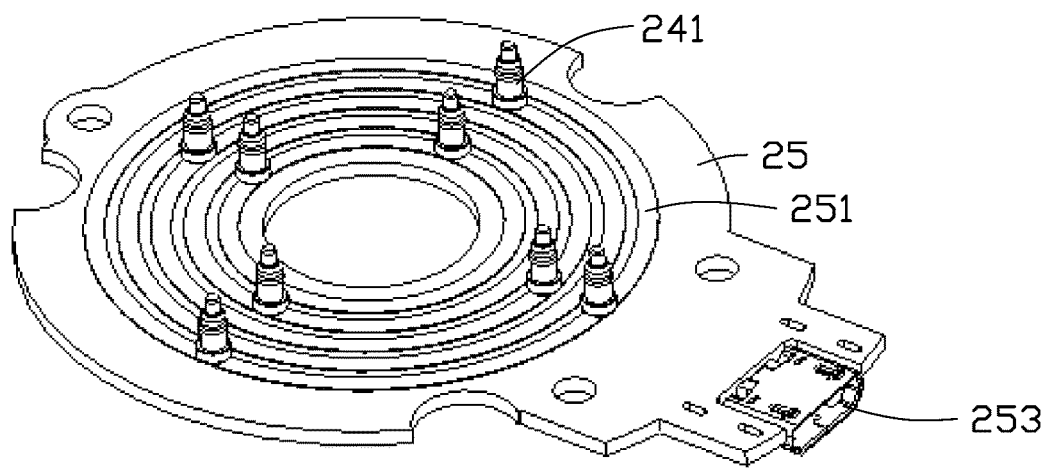
Figure 16:
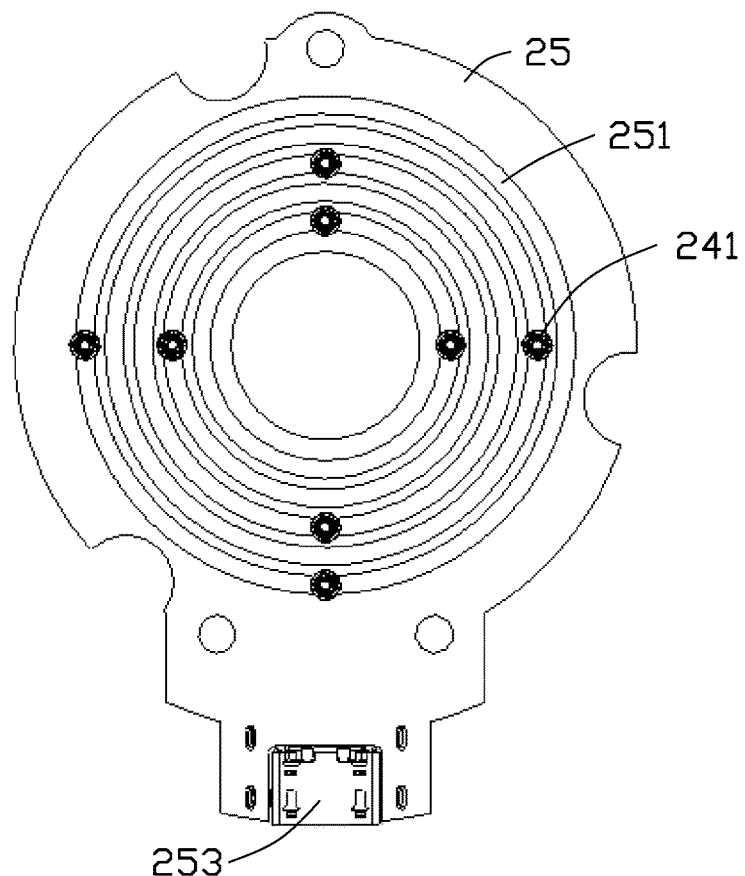

As illustrated in FIG. 14 to FIG. 16, in this exemplary embodiment, the voice control device 100 further includes a first circuit board 24 and a second circuit board 25. The first circuit board 24 is positioned inside the upper housing 22 adjacent to the lower housing 23. The second circuit board 25 is positioned inside the lower housing 23 adjacent to the upper housing 22 and is electrically connected to the first circuit board 24.

The second circuit board 25 includes five annular conductive traces 251. The first circuit board 24 includes at least five conductive pins 241. Ends of the at least five conductive pins 241 are respectively contact the five annular conductive traces 251 of the second circuit board 25. When the upper housing 22 and the lower housing 23 rotate relative to each other, distal ends of the conductive pins 241 contact and slide along the five annular conductive traces 251 of the second circuit board 25, thereby maintaining an electrical connection between the first circuit board 24 and the second circuit board 25.

In this exemplary embodiment, the first circuit board 24 includes eight conductive pins 241. The eight conductive pins 241 are evenly fixed on the first circuit board 24 and electrically contact the five annular conductive traces 251 on the second circuit board 25, thereby achieving an electrical connection between the first circuit board 24 and the second circuit board 25 and increasing stability of the rotation between the upper housing 22 and the lower housing 23.

In this exemplary embodiment, the second circuit board 25 further includes a power connector 253 (for example, a USB connector). The five annular conductive traces 251 of the second circuit board 25 respectively connect to five pins of the power connector 253. Accordingly, an external power source received by the power connector 253 can be transmitted to the first circuit board 24 of the upper housing 22 through the electrical contacts between the second circuit board 25 and the conductive pins 241, thereby supplying the required power for electronic components in the upper housing 22. In one exemplary embodiment, the electronic components in the upper housing 22 mainly include, but are not limited to, all of the electronic modules and circuits in FIG. 3.

FIG. 17 to FIG. 21 illustrate a second exemplary voice control device 100a. The voice control device 100a is similar to the voice control device 100 and differs from the voice control device 100 in that a location of the microphone through holes 123a on the voice control device 100a is different from the location of the microphone through holes 123.

Figure 17:
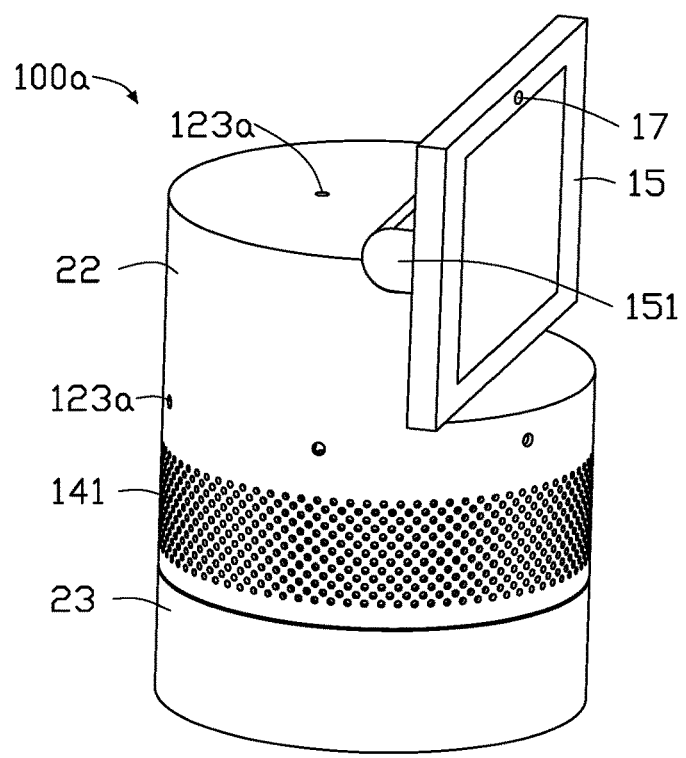
FIG. 17 to FIG. 21 are schematic views of a voice control device according to a second exemplary embodiment of the present disclosure.
Figure 18:
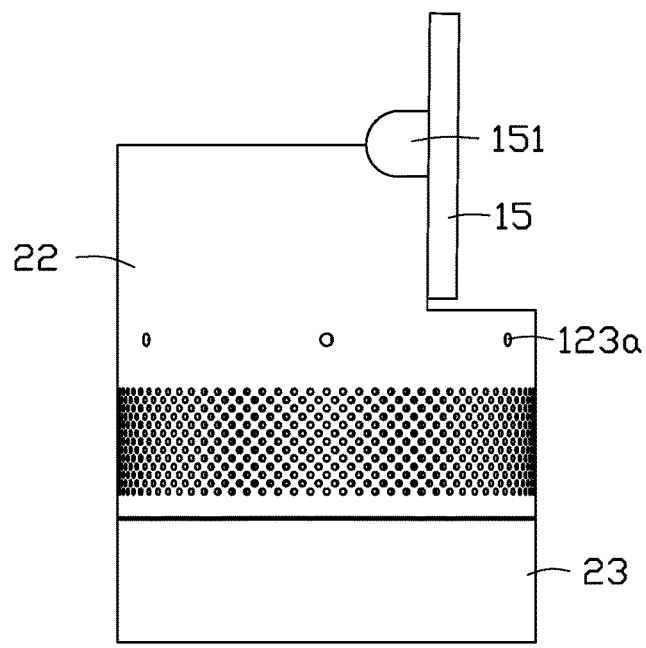
Figure 19:
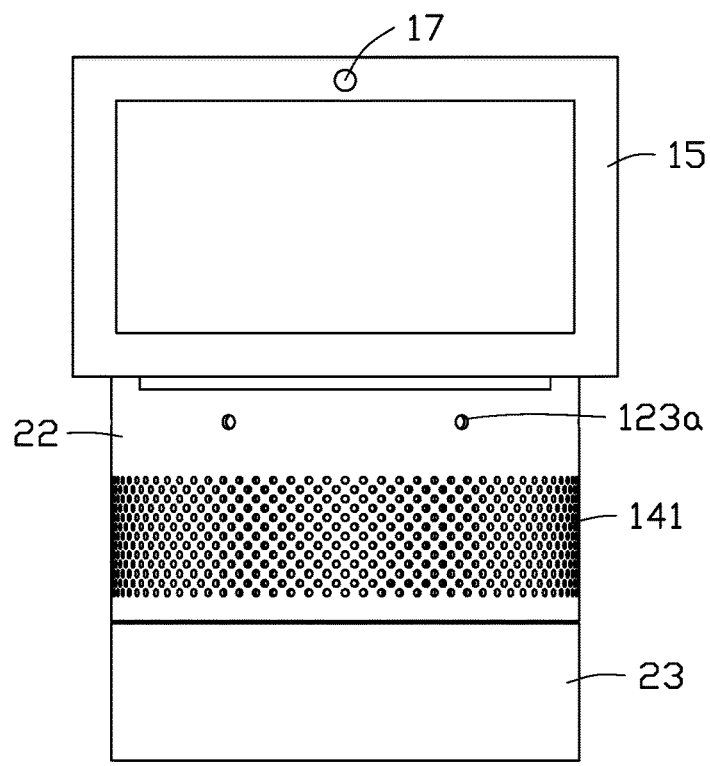

As illustrated in FIG. 17 to FIG. 19, the microphone through hole 123a corresponding to the first microphone unit 121 is positioned on a location adjacent to a center of the top plane of the upper housing 22. The microphone through holes 123a corresponding to the second microphone units 122 are evenly positioned at a side wall of the upper housing 22 for receiving an external voice signal from each direction.

In this exemplary embodiment, the voice control device 100a further differs from the voice control device 100 in that a structure of the tilting drive unit 162a is different from the structure of the tilting drive unit 162 in the first exemplary embodiment.

Figure 20:
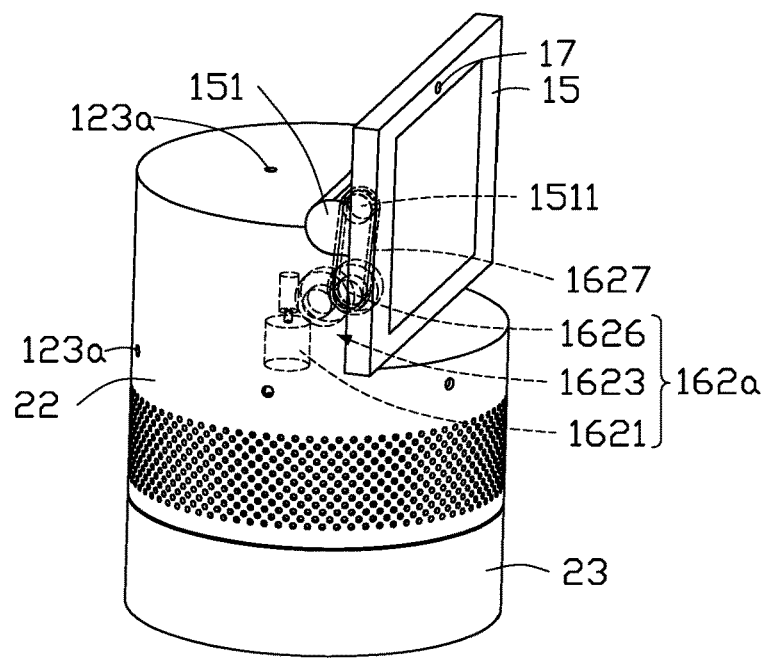
Figure 21:
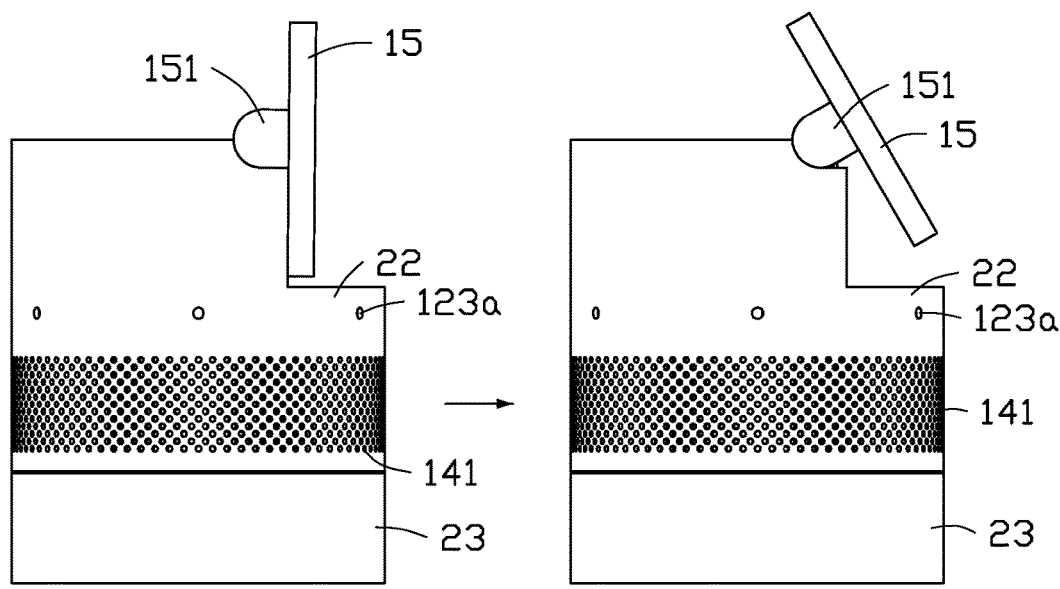

As illustrated in FIG. 20 and FIG. 21, the tilting drive unit 162a includes a second motor 1621, a second gear set 1623, and an interlocking gear 1626. In this exemplary embodiment, the second motor 1621, the second gear set 1623 and the interlocking gear 1626 are all positioned inside the upper housing 22 and disposed in a back of the display 15. The interlocking gear 1626 is coupled to a transmission gear 1511 of the connecting structure 151 through a transmission belt 1627.

When the second motor 1621 is activated, the second motor 1621 drives the interlocking gear 1626 through the second gear set 1623 and then drives the transmission gear 1511 through the transmission belt 1627, thereby pushing the display 15 away from the upper housing 22 or pulling the display 15 back inwardly to the upper housing 22 (shown in FIG. 21). Accordingly, a tilting angle of the display 15 can be adjusted according to a viewing angle of the user, so that the display 15 is tilted at a suitable angle for the user to watch.

FIG. 22 to FIG. 26 illustrate a third exemplary voice control device 100b. The voice control device 100b is similar to the voice control device 100 and differs from the voice control device 100 in that a location of the microphone through holes 123b on the voice control device 100b is different from the location of the microphone through holes 123.

Figure 22:
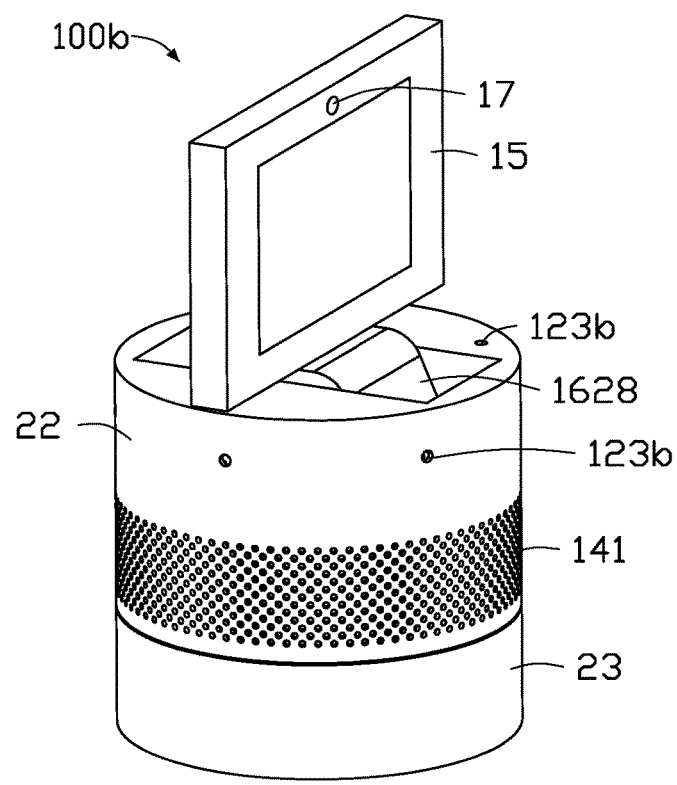
FIG. 22 to FIG. 26 are schematic views of a voice control device according to a third exemplary embodiment of the present disclosure.
Figure 23:
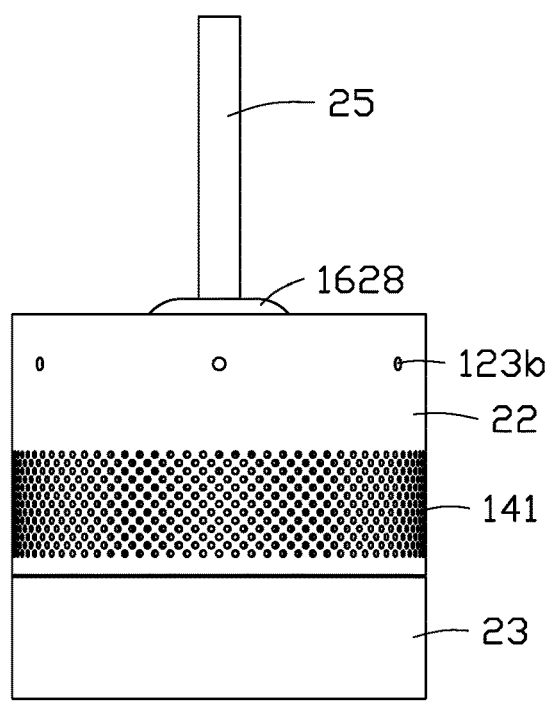
Figure 24:
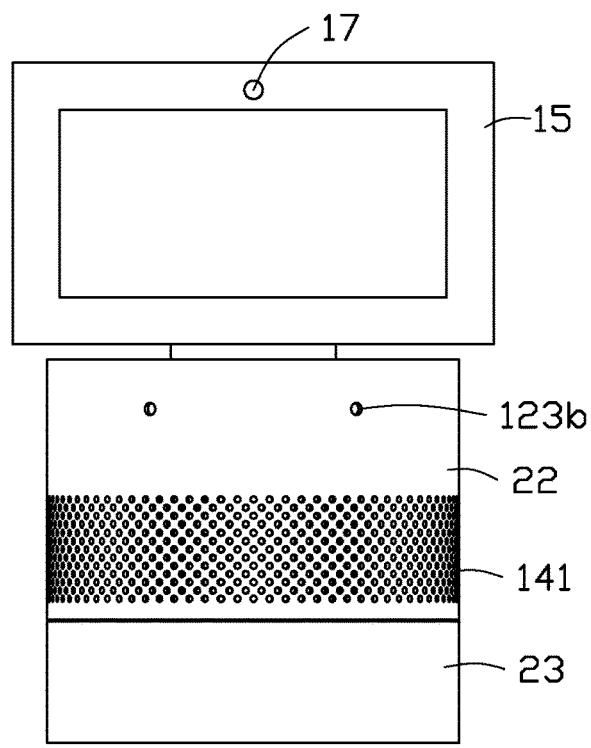

As illustrated in FIG. 22 to FIG. 24, the microphone through hole 123b corresponding to the first microphone unit 121 is positioned on a location adjacent to a center of the top plane of the upper housing 22. The microphone through holes 123b corresponding to the second microphone units 122 are evenly positioned at a side wall of the upper housing 22 for receiving an external voice signal from each direction.

In this exemplary embodiment, the voice control device 100b further differs from the voice control device 100 in that a structure of the tilting drive unit 162b is different from the structure of the tilting drive unit 162 in the first exemplary embodiment.

Figure 25:
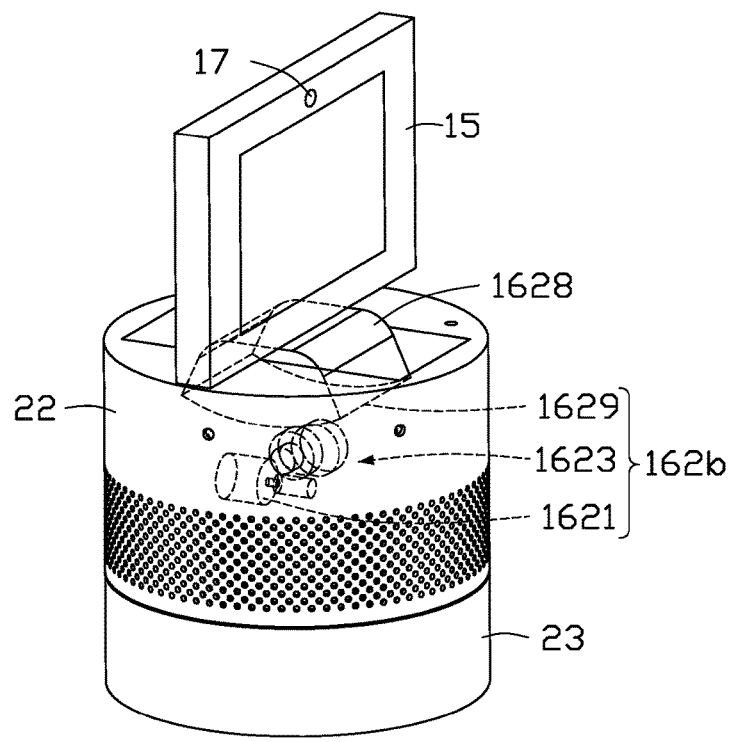
Figure 26:
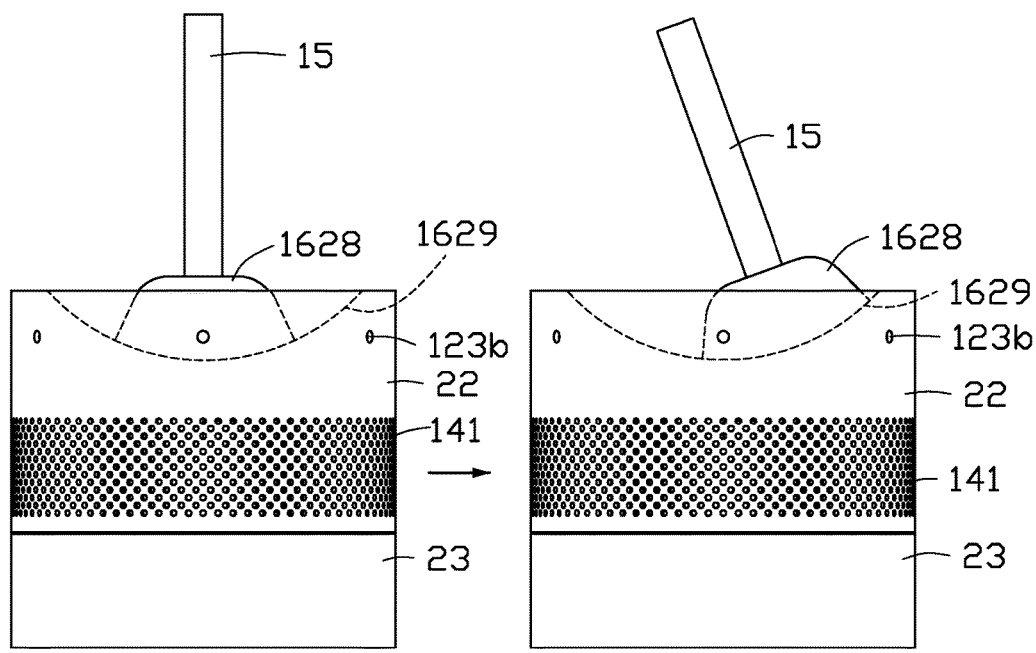
Figure 27:
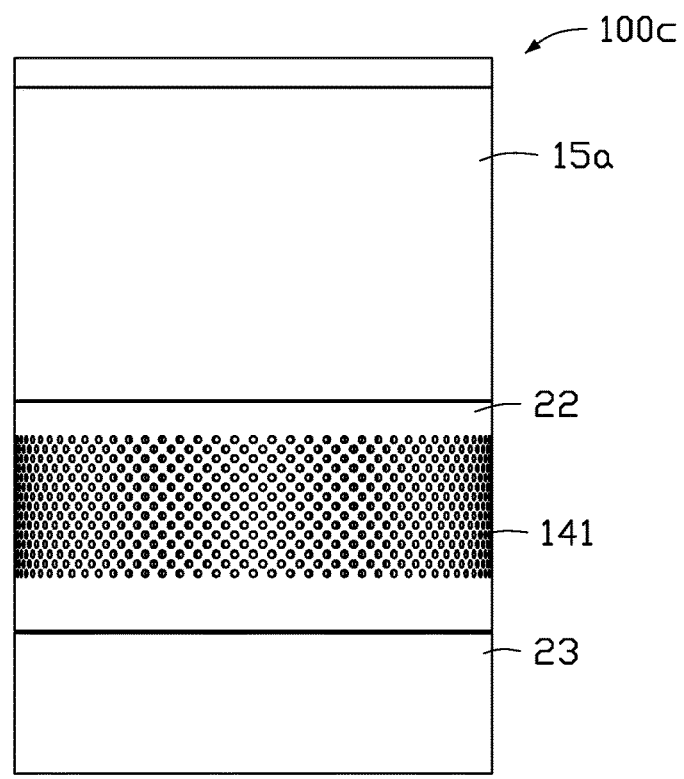
FIG. 27 to FIG. 28 are schematic views of a voice control device according to a fourth exemplary embodiment of the present disclosure.
Figure 28:
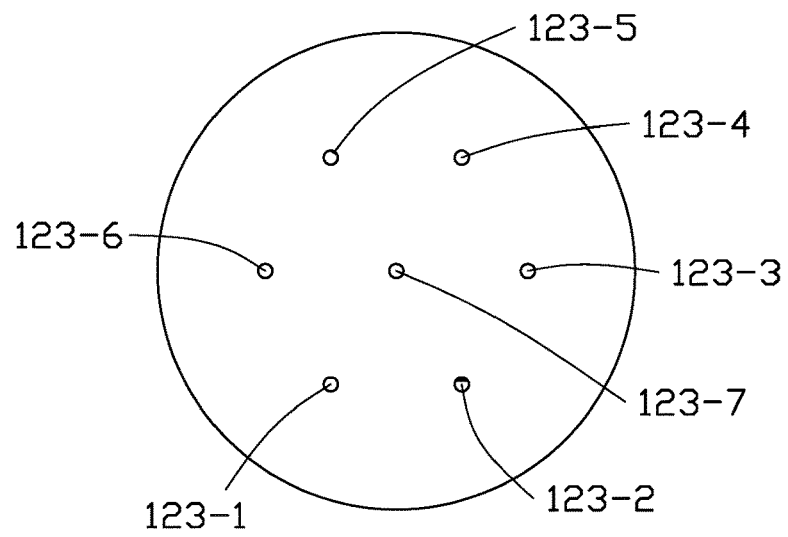

As illustrated in FIG. 25 and FIG. 26, the tilting drive unit 162b includes a second motor 1621, a second gear set 1623 and a base 1628. In this exemplary embodiment, the second motor 1621 and the second gear set 1623 are both positioned inside the upper housing 22. One end of the base 1628 is coupled to a bottom of the display 15. Another end of the base 1628 includes at least one gear track 1629. The at least one gear track 1629 is coupled to the second motor 1621 through the second gear set 1623.

When the second motor 1621 is activated, the second motor 1621 drives the at least one gear track 1629 of the base 1628 through the second gear set 1623 and then drives the display 15 to tilt. Then the display 15 is tilted at a tilting angle relative to the upper housing 22. Accordingly, a viewing angle of the display 15 is changed, so that the display 15 is tilted at a suitable angle for the user to watch.

FIG. 27 to FIG. 30 illustrate a fourth exemplary voice control device 100c. The voice control device 100c is similar to the voice control device 100 and differs from the voice control device 100 in that the voice control device 100c does not include the drive module 16. The voice control device 100c further differs from the voice control device 100 in that the display 15a is a flexible display and is positioned on a side wall of the upper housing 22.

In this exemplary embodiment, when the voice control device 100c works, the voice control device 100c utilizes the first microphone unit 121 and the second microphone units 122 to receive an external sound through a plurality of microphone through holes 123-1 to 123-7. The voice control device 100c utilizes the voice encoding module 13 or the processing unit 19 to determine a sound source direction based on the received sound. After the sound encoding module 13 or the processing unit 19 determines the sound source direction, the processing unit 19 transmits corresponding information (such as text information or image information) to the display 15a, so that the display 15a displays the corresponding information on a display area corresponding to the sound source direction.

Figure 29:
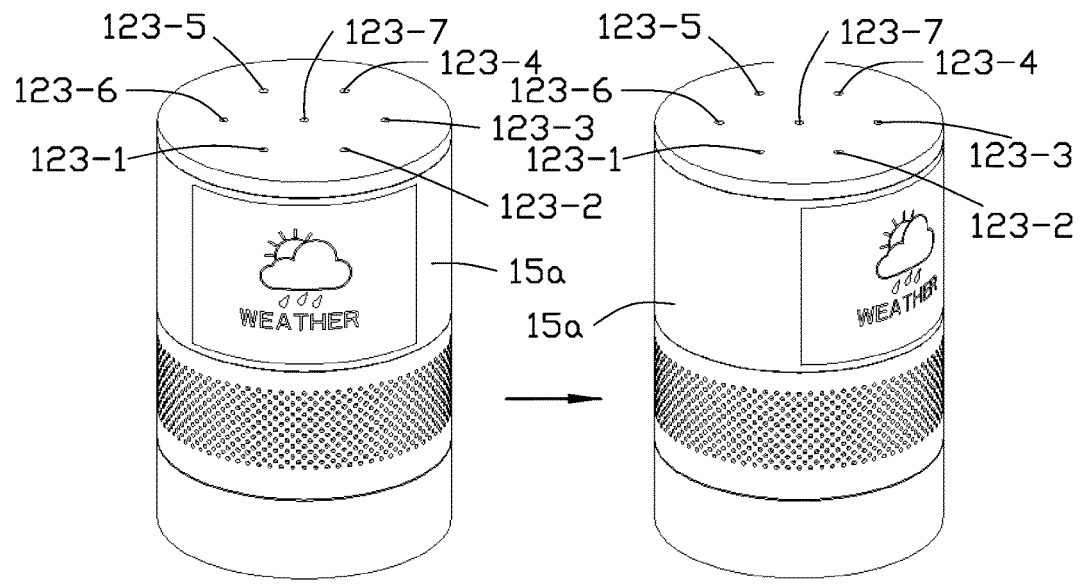
FIG. 29 is a schematic view of the voice control device of FIG. 27, showing a display displaying graphic information in different display areas according to a sound source direction.
Figure 30:
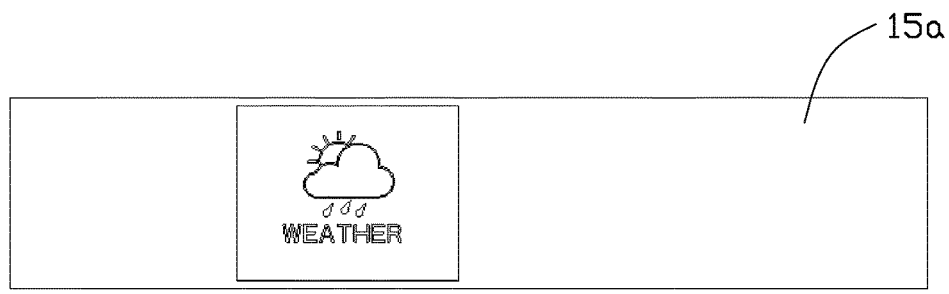
FIG. 30 is a schematic view of the voice control device of FIG. 27, showing the graphic information being displayed in different display areas.
Figure 30:
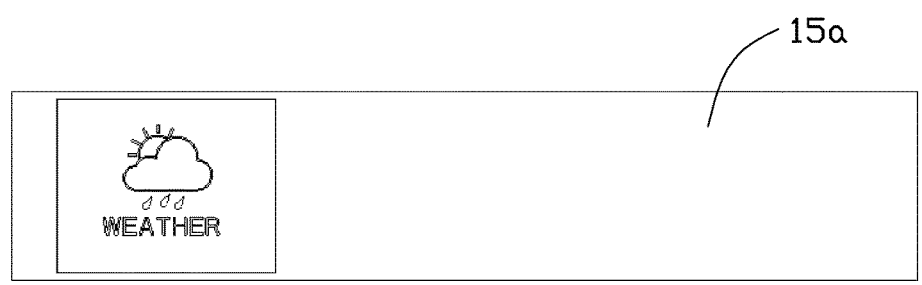

As illustrated in FIG. 29, a graphic information (such as weather pattern) can be displayed in different display areas on the display 15c according to the sound source direction. For example, when the determined sound source direction is a direction corresponding to the microphone through holes 123-1 and 123-2, the graphic information (such as the weather pattern) is displayed on a display area corresponding to the microphone through holes 123-1 and 123-2. When the determined sound source direction is a direction corresponding to the microphone through holes 123-2 and 123-3, the graphic information (such as the weather pattern) is displayed on a display area corresponding to the microphone through holes 123-2 and 123-3.

Figure 31:
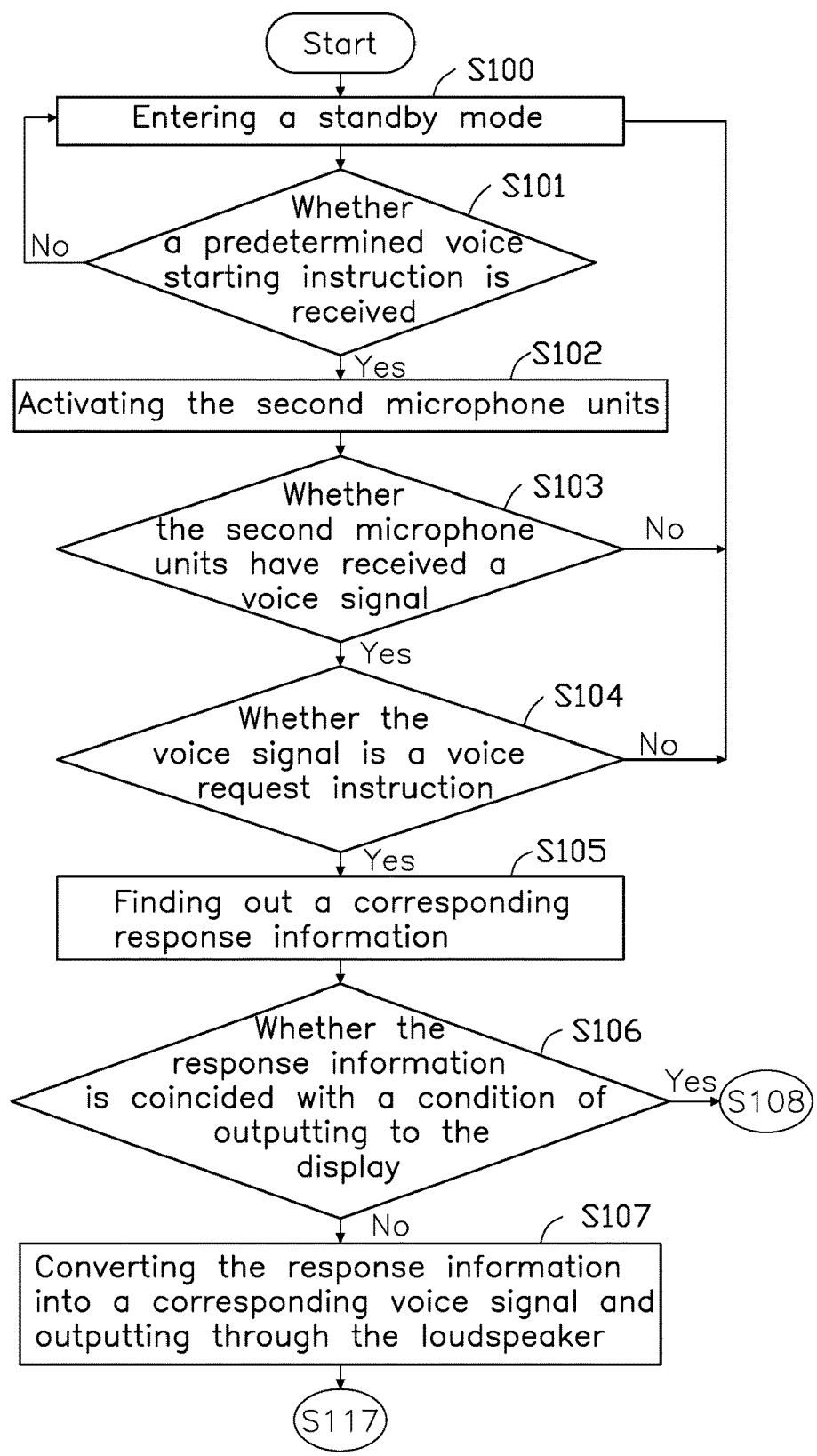
FIG. 31 to FIG. 33 are flowcharts of a voice control method according to an exemplary embodiment of the present disclosure.
Figure 32:
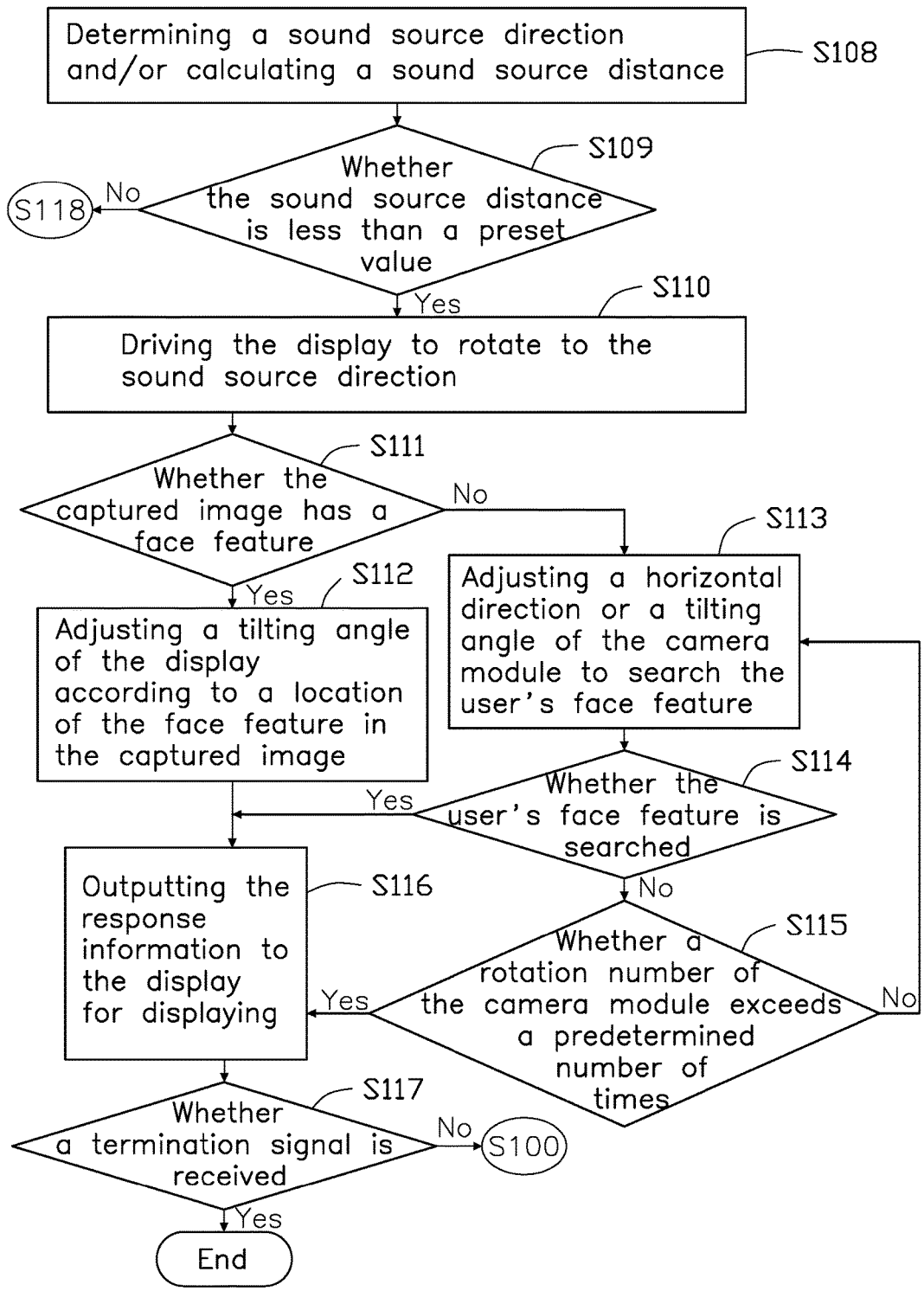
Figure 33:
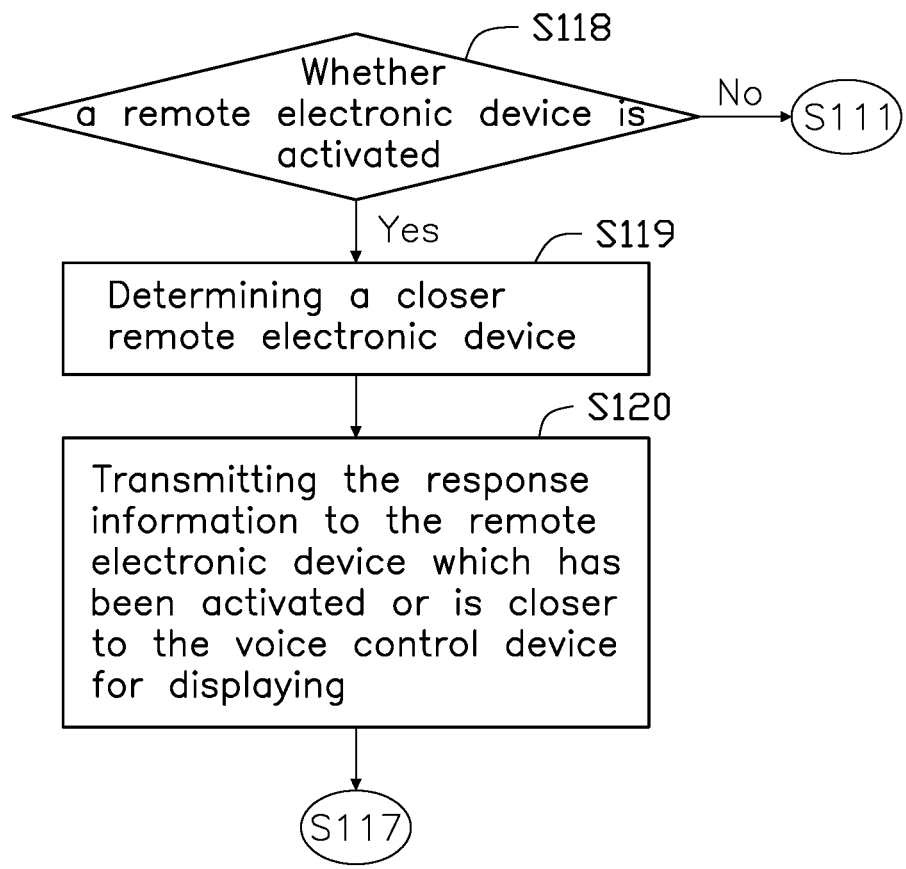

FIG. 31 to FIG. 33 illustrates a flowchart of a voice control method. The method is provided by way of example, as there are a variety of ways to carry out the method. Each block shown in FIG. 31 to FIG. 33 represents one or more processes, methods, or subroutines which are carried out in the example method. Furthermore, the order of blocks is illustrative only and additional blocks can be added or fewer blocks may be utilized without departing from the scope of this disclosure.

At block S100, the voice control device 100 enters a standby mode after the voice control device 100 is powered on. In the standby mode, the first microphone unit 121 of the voice control device 100 is in an activated state for receiving a voice signal. The second microphone units 122 are in a deactivated state.

At block S101, the first microphone unit 121 receives a voice signal and transmits the voice signal to the voice encoding module 13. The voice encoding module 13 directly determines whether the voice signal received by the first microphone unit 121 is a predetermined voice starting instruction. If yes, block S102 is performed. If not, returning to block S100, that is, the voice control device 100 continues to remain in the standby mode for continuously receiving the external voice signal through the first microphone unit 121.

In other exemplary embodiments, when the first microphone unit 121 receives a voice signal, the first microphone unit 121 transmits the voice signal to the voice encoding module 13. The voice encoding module 13 processes the voice signal (for example, including but not limited to, converting the voice signal into a digital voice signal from an analog signal) and transmits the processed voice signal to the processing unit 19. The processing unit 19 receives the voice signal and determines whether the voice signal is the predetermined voice starting instruction through the voice analysis module 200B executed by the processing unit 19. If yes, block S102 is performed. If not, returning to block S100, that is, the voice control device 100 continues to remain in the standby mode for continuously receiving the external voice signal through the first microphone unit 121.

In this exemplary embodiment, the predetermined voice starting instruction may be [Hello] or other voice starting instructions predefined by the user.

At block S102, when the voice signal is determined to be the predetermined voice starting instruction, the voice encoding module 13 or the processing unit 19 transmits a starting signal to activate the second microphone units 122. Then the second microphone units 122 are activated to receive a voice signal following the predetermined voice starting instruction.

For example, when the user says [hello! how is the weather today in Taipei], the first microphone unit 121 receives the voice starting instruction [hello], and the second microphone units 122 receive the subsequent voice signal [how is the weather today in Taipei].

At block S103, when the second microphone units 122 are activated, the voice encoding module 13 determines whether the second microphone units 122 have received a subsequent voice signal for a predetermined time. If yes, block S104 is performed. If not, returning to block S100, that is, the voice control device 100 returns to the standby mode and deactivates the second microphone units 122, and only the first microphone unit 121 is in the active state for receiving a voice starting instruction.

At block S104, when at least one of the second microphone units 122 receives a subsequent voice signal, the received voice signal will be transmitted to the voice encoding module 13, such that the voice encoding module 13 can determine whether the voice signal is a voice request instruction. When the voice signal is determined to be a voice request instruction, block S105 is performed. If not, for example, the voice signal is a non-meaningful voice or a noise, block S101 is performed.

In other exemplary embodiments, when at least one of the second microphone units 122 receives a subsequent voice signal, the received voice signal will be transmitted to the voice encoding module 13. The voice encoding module 13 processes the voice signal and transmits the processed voice signal to the processing unit 19. The processing unit 19 receives the voice signal and determines whether the voice signal is a voice request instruction through the voice analysis module 200B executed by the processing unit 19. When the voice signal is determined to be a voice request instruction, block S105 is performed. If not, for example, the voice signal is a non-meaningful voice or a noise, block S101 is performed.

In this exemplary embodiment, the voice analysis module 200B determines whether the voice signal is voice request instruction according to the data (for example, a phonetic word library) stored in the voice database 200A. Alternatively, the voice analysis module 200B transmits the voice signal to the network server 300 through the first wireless communication module 11. Then the voice analysis program and/or the voice database of the network server 300 determines whether the voice signal is voice request instruction. The network server 300 then returns a determination to the voice analysis module 200B executed by the processing unit 19.

In this exemplary embodiment, the voice request instruction may include at least, but not limited to, two types: a control-type voice instruction, an instruction-type voice instruction and a question-type voice instruction. The control-type voice instruction includes, for example, [turn on the TV], [adjust the volume], [open the music player], [play music], and various instructions for controlling the remote electronic devices 201, 202, 203. The instruction-type voice instruction includes, for example, [ordering pizza], [booking tickets], [booking hotels], and other ordering or booking instructions. The question-type voice instructions includes, for example, [how is the weather today in Taipei], [which movies are there today], [which games are there today], and other question-type instructions.

At block S105, when the voice signal is determined to be a voice request instruction, the voice analysis module 200B finds out a corresponding response information from the voice database 200A or the image database. For example, when the voice request instruction is [how is the weather today in Taipei], the corresponding response information can be [today is sunny day in Taipei]. For example, when the voice request instruction is [how is the traffic situation in Taipei], the corresponding response information may be a map of a traffic situation or may be [the current traffic is in a serious traffic jam and needs to drive 2 hours to arrive].

In other exemplary embodiments, the corresponding response information may also be found out by the voice analysis program and/or the voice database of the network server 300 described in block S104 according to the voice request instruction, and then be returned to the voice analysis module 200B executed by the processing unit 19.

At block S106, the processing unit 19 determines whether the response information is coincided with a condition of outputting to the display 15. If yes, block S107 is performed. If not, block S108 is performed.

For example, in one exemplary embodiment, when the content of the response information belongs to text information and exceeds a preset number (for example, more than 50 words or 5 sentences), or belongs to image information, video information, map information, URL link information, or any form/list information, the processing unit 19 determines that the response information is coincided with the condition of outputting to the display 15. Then the response information can be outputted to the display 15 for the user to view. Otherwise, the processing unit 19 determines that the response information is not coincided with the condition of outputting to the display 15. Then the response information is outputted to the loudspeaker 14 for responding to the user.

For example, in one exemplary embodiment, when the content of the response information belongs to the text information and the number of words is less than a predetermined number of words (for example, less than 50 words or less than five sentences), the processing unit 19 determines that the content of the response information is not coincided with the condition of outputting to the display 15. Then the response information is outputted to the loudspeaker 14 for responding to the user.

At block S107, when the response information is not coincided with the condition of outputting to the display 15, through executing the voice generation module 200C, the processing unit 19 converts the response information (for example, [today is sunny day in Taipei] or [the current traffic is in a serious traffic jam and needs to drive 2 hours to arrive]) obtained from the voice database 200A or the network server 300 into a corresponding voice signal. The processing unit 19 transmits the corresponding voice signal to the voice encoding module 13. Finally, the loudspeaker 14 generates a voice accordingly, such as [today is sunny day in Taipei] or [the current traffic is in a serious traffic jam and needs to drive 2 hours to arrive] for responding to the user, and block S117 is then performed.

At block S108, when the response information is coincided with the condition of outputting to the display 15, the voice encoding module 13 or the processing unit 19 further determines a sound source direction of the voice signal received by the second microphone units 122 (i.e., a direction of the user relative to the voice control device 100), and/or calculates a sound source distance (i.e., a distance of the user relative to the voice control device 100).

In this exemplary embodiment, the voice encoding module 13 or the processing unit 19 may analyze and compare amplitudes of the voice signals respectively received by the second microphone units 122 at the same time, thereby determining a sound source direction according to one of the second microphone units 112 receiving a voice signal with the biggest amplitude. The sound source direction is a horizontal direction directed by a position of the one of the second microphone units 122 receiving the voice signal with the biggest amplitude.

In this exemplary embodiment, the processing unit 19 may calculate the distance between the user and the voice control device 100 through the distance module 200E. In other exemplary embodiments, the processing unit 19 may calculate the distance between the user and the voice control device 100 through a focus distance of the image captured by the camera module 17. The processing unit 19 may calculate the distance between the user and the voice control device 100 through other laser or infrared modules (not shown) via laser ranging method or optical ranging method.

At block S109, the processing unit 19 determines whether the calculated sound source distance (i.e., the distance between the user and the voice control device 100) is less than a preset value. If yes, block S110 is performed. If not, block S118 is performed.

In other exemplary embodiments, at block S107, the processing unit 19 may adjust a sound output volume of the voice control device 100 according to the calculated sound source distance (i.e., the distance between the user and the voice control device 100).

For example, in one exemplary embodiment, when the sound source distance is greater than a predetermined value, e.g., five meters, the sound output volume of the loudspeaker 14 is increased, so that the user who is five meters away from the voice control device 100 can hear the sound generated by the loudspeaker 14. In another exemplary embodiment, when the sound source distance is greater than a predetermined value, e.g., five meters, the voice control device 100 transmits through the second wireless communication module 21 the voice signal corresponding to the response information to at least one of the remote electronic devices 201, 202, 203, which is recorded by the device management module 200D as one having a loudspeaker and being in a power-on state, for playing.

At block S110, the processing unit 19 generates a rotation drive signal based on the sound source direction determined at block S108 and transmits the rotation drive signal to the drive module 16. According to the rotation drive signal, the rotation drive unit 161 of the drive module 16 is driven to rotate the upper housing 22, thereby driving the display 15 to rotate to the sound source direction.

At block S111, when the display 15 is rotated to the sound source direction, the processing unit 19 then activates the camera module 17 to capture an image. The captured image is transmitted to the image recognition module 18. The image recognition module 18 recognizes whether the captured image has a face feature. When the recognition module 18 recognizes that there is a face feature existing in the captured image, block S112 is performed. When the recognition module 18 recognizes that there is no face feature existing in the captured image, block S113 is performed.

In other exemplary embodiments, at block S111, the processing unit 19 can replace the image recognition module 18 to recognize and determine whether the captured image has a face feature.

At block S112, the processing unit 19 generates a tilting drive signal according to a location of the face feature in the captured image and transmits the tilting drive signal to the drive module 16. According to the tilting drive signal, the tilting drive unit 162 of the drive module 16 is driven to adjust a tilting angle of the display 15 relative to the upper housing 22.

For example, it is assumed that the camera module 17 is located adjacent to a middle position of a frame above the display 15. When the processing unit 19 determines that the face feature is located at an upper half position of the captured image, which indicates that the user's face is located at a position higher than the display 15, the tilting drive signal may adjust the display 15 to move upwards until the processing unit 19 determines that the face feature is located at the center horizontal line of the captured image.

For example, it is assumed that the camera module 17 is located adjacent to a middle position of a frame above the display 15. When the processing unit 19 determines that the face feature is located at a left half position of the captured image, which indicates that the user's face is closer to the left side of the display 15, the tilting drive signal may adjust the display 15 to move left until the processing unit 19 determines that the face feature is located at the center vertical line of the captured image.

In this exemplary embodiment, the image recognition module 18 may keep tracking the user's location and instantly transmit the captured image to the processing unit 19. Then the processing unit 19 may instantly generate a control signal according to the user's location and transmit the control signal to the rotation drive unit 161 and/or the tilting drive unit 162, thereby adjusting a horizontal direction and a tilting angle of the display 15 immediately. In other exemplary embodiments, any method that can be generally known to be used to track the direction and calculate the distance of the user can be applied to the present invention and is not limited to the above-described manner.

At block S113, when the image recognition module 18 recognizes that the captured image does not have a face feature, the processing unit 19 generates the rotation drive signal or the tilting drive signal. The processing unit 19 further transmits the rotation drive signal or the tilting drive signal to the drive module 16. Then the upper housing 22 is rotated to adjust the horizontal direction of the camera module 17 or the display 15 is tilted to adjust the tilting angle of the camera module 17, thereby searching the user's face feature.

In one exemplary embodiment, according to a plurality of rotation drive signals received in sequence, the rotation drive unit 161 sequentially rotates the camera module 17 in a clockwise direction or a counterclockwise direction for searching the user's face feature.

At block S114, the processing unit 19 or the image recognition module 18 determines whether the camera module 17 has searched and identified the user's face feature. If yes, block S116 is performed. If not, block S115 is performed.

At block S115, the processing unit 19 determines whether a rotation number of the camera module 17 exceeds a predetermined number of times. If yes, block S116 is performed. If not, block S113 is performed.

At block S116, the processing unit 19 outputs the response information to the display 15, thereby displaying the response information to the user through the display 15.

At block S117, the processing unit 19 determines whether a termination signal is received. If yes, the process is terminated. If not, block S100 is performed.

In this exemplary embodiment, the termination signal may be a voice termination instruction or a power off signal.

At block S118, the processing unit 19 determines whether a remote electronic device is activated. If yes, block S119 is performed. If not, block S111 is performed.

In one exemplary embodiment, the processing unit 19 may determine whether the remote electronic device is activated through records recorded by the device management module 200D for the remote electronic devices 201, 202.

In other exemplary embodiments, the processing unit 19 may determine whether the remote electronic device is activated through determining whether the second wireless communication module 21 is connected to the remote electronic devices 201, 202. In other exemplary embodiments, the processing unit 19 may determine whether the remote electronic device is activated through determining whether a predetermined remote electronic device 201 or 202 is set by the device management module 200D.

At block S119, when the processing unit 19 determines that there is a remote electronic device activated, the processing unit 19 determines a closer remote electronic device for displaying the response information.

For example, in one exemplary embodiment, the processing unit 19 may determine the wireless signal strength of the remote electronic devices 201, 202 through the second wireless communication module 21, thereby determining a closer one of the remote electronic devices 201, 202.

In other exemplary embodiments, based on the calculated distance between the user and the voice control device 100 or the focusing distance of the image captured by the camera module 17, the processing unit 19 can determine the distance between the user and the voice control device, thereby determining a closer one of the remote electronic devices 201, 202.

At block S120, through the second wireless communication module 21, the processing unit 19 transmits the response information to the remote electronic device 201 and/or the remote electronic device 202 which has been activated or is closer to the voice control device 100. Then the response information can be displayed by the remote electronic device 201 and/or the remote electronic device 202, and block S117 is performed.

In other exemplary embodiments, block S119 may be omitted, and the process proceeds directly to block S120 from block S118.

The voice control device 100 can effectively adjust a rotation of the display 15 according to the sound source direction, and can also effectively adjust a tilting angle of the display 15 according to whether there is a user feature existing in the captured image, so that the voice control device 100 can be directed towards the user more accurately. Additionally, the voice control device 100 may use different presentation manners according to different types of information. For example, when the information is coincided with a condition of outputting to the display 15, the information is outputted through the display 15. When the information is not coincided with the condition of outputting to the display 15, the information is outputted through the loudspeaker 14, thus is practical and convenient.

It is believed that the embodiments and their advantages will be understood from the foregoing description, and it will be apparent that various changes may be made thereto without departing from the scope of the disclosure or sacrificing all of its advantages, the examples hereinbefore described merely being illustrative embodiments of the disclosure.

What is claimed is:

1. A voice control device, comprising:
a microphone module for receiving a voice signal;
a voice encoding module electrically connected to the microphone module;
a display;
a processing unit electrically connected to the voice encoding module and the display; and
a camera module electrically connected to the processing unit and positioned on the display;
wherein the microphone module transmits the voice signal to the voice encoding module, and one of the voice encoding module and the processing unit analyzes and processes the voice signal to determine a sound source direction of the voice signal and obtains response information according to the voice signal;
wherein the processing unit controls the display to rotate to the sound source direction and activates the camera module to capture an image after the display is rotated to the sound source direction, and
wherein the processing unit determines whether a face feature is in the image and adjusts a tilting angle of the display according to a location of the face feature in the image captured by the camera and transmits the response information to the display for displaying the response information.

2. The voice control device of claim 1, wherein the processing unit further transmits the voice signal to a network server, which finds out the response information, and receives the response information from the network server.

3. The voice control device of claim 1, wherein the microphone module comprises a first microphone unit and a second microphone unit, and wherein when the first microphone unit receives a predetermined voice starting instruction, the second microphone unit is activated to receive the voice signal.

4. The voice control device of claim 1, further comprising a drive module, wherein the drive module comprises a rotation drive unit and a tilting drive unit, and the processing unit controls the display to rotate to the sound source direction through the rotation drive unit; and wherein the processing unit adjusts the tilting angle of the display through the tilting drive unit.

5. The voice control device of claim 4, further comprising an upper housing and a lower housing, wherein the display is positioned on the upper housing, and the rotation drive unit comprises a first motor, a first gear set and a first gear track connected to one another; wherein the first gear track is positioned on an inner wall of the lower housing or an inner wall of the upper housing, and the first motor is electrically connected to the processing unit; and wherein the processing unit drives the first motor and then drives through the first motor the first gear set to rotate, and the first gear set drives the first gear track to rotate so as to make a relative rotation between the upper housing and the lower housing, thereby rotating the display to the sound source direction.

6. The voice control device of claim 5, wherein the tilting drive unit comprises a second motor and a second gear set, the second gear set is coupled to the display, and the second motor is electrically connected to the processing unit; and wherein the processing unit drives the second motor and then drives through the second motor the second gear set to rotate so as to tilt the display, thereby adjusting the tilting angle of the display.

7. The voice control device of claim 5, wherein the microphone module comprises a plurality of microphone units for receiving the voice signal, and the one of the voice encoding module and the processing unit determines the sound source direction according to the voice signal received by at least one of the plurality of microphone units.

8. The voice control device of claim 7, wherein a top plane or a side wall of the upper housing defines a plurality of microphone through holes, and the plurality of microphone through holes corresponds to the plurality of microphone units respectively.

9. The voice control device of claim 1, further comprising a loudspeaker, wherein when the voice encoding module or the processing unit determines that the voice signal is a voice request instruction, the voice encoding module or the processing unit obtains the response information and outputs the response information to the loudspeaker or the display.

10. The voice control device of claim 9, further comprising a memory, wherein the memory is electrically connected to the processing unit and stores a voice database, and the processing unit determines whether the voice signal is the voice request instruction according to data stored in the voice database.

11. The voice control device of claim 9, further comprising a first wireless communication module, wherein the first wireless communication module is electrically connected to the processing unit, and the processing unit transmits the voice signal to a network server through the first wireless communication module, so as to determine whether the voice signal is the voice request instruction through a voice analysis program or a voice database of the network server.

12. The voice control device of claim 9, wherein when the voice encoding module or the processing unit determines that the voice signal is a control instruction, the voice control device transmits the control instruction to a corresponding remote electronic device.

13. The voice control device of claim 9, wherein the processing unit further calculates a distance between a user and the voice control device; and wherein when the response information is outputted to the loudspeaker, the processing unit further adjusts a sound output volume of the loudspeaker according to the distance.

14. A voice control method applied to a voice control device, the voice control device comprising a display and a camera module; the method comprising:
(a) receiving a voice signal;
(b) processing the voice signal to determine a sound source direction of the voice signal;
(c) analyzing the voice signal to obtain a response information;
(d) controlling the display to rotate to the sound source direction;
(e) activating the camera module to capture an image after the display is rotated to the sound source direction;
(f) determining whether a user feature is in the image captured by the camera, and adjusting a tilting angle of the display according to a location of the user feature in the captured image; and
(g) transmitting the response information to the display for displaying the response information.

15. The method of claim 14, wherein when the step (c) is performed, the method further comprises:
(c1) transmitting the voice signal to a network server for finding out the response information through the network server; and
(c2) receiving the response information from the network server.

16. The method of claim 14, wherein the voice control device further comprises a first microphone unit and a second microphone unit, the method further comprising:
activating the second microphone unit to receive the voice signal when the first microphone unit receives a predetermined voice starting instruction.

17. The method of claim 14, further comprising:
determining whether the response information is coincided with a condition of outputting to the display;
converting the response information into a corresponding voice signal and playing the corresponding voice signal through a loudspeaker when the response information is not coincided with the condition of outputting to the display; and
performing step (b) when the response information is coincided with the condition of outputting to the display.

18. The method of claim 17, wherein when the response information is coincided with the condition of outputting to the display, the method further comprises:
calculating a distance between a user and the voice control device;
determining whether the distance between the user and the voice control device is less than a preset distance; and
generating a first rotation drive signal according to the sound source direction to control the display to rotate to the sound source direction when the distance between the user and the voice control device is less than the preset distance.

19. The method of claim 18, wherein when the distance between the user and the voice control device is larger than the preset distance, the method further comprises:
transmitting the response information to a remote electronic device for displaying the response information.

20. The method of claim 14, wherein the step (f) further comprises:
generating a first tilting drive signal according to a location of the user feature in the captured image when there is a user feature existing in the captured image, so as to adjust the tilting angle of the display.

21. The method of claim 20, wherein when there is no user feature existing in the captured image, the method further comprises:
generating a second rotation drive signal or a second tilting drive signal to adjust a horizontal direction or a tilting angle of the camera module for searching a user feature.

22. The method of claim 17, wherein when the response information is not coincided with the condition of outputting to the display, the method further comprises:
calculating a distance between the user and the voice control device; and
adjusting a sound output volume of the loudspeaker according to the distance.

23. A voice control system, comprising:
a network server; and
a voice control device, comprising:
a microphone module for receiving a voice signal;
a voice encoding module electrically connected to the microphone module;
a display;
a processing unit electrically connected to the voice encoding module and the display; and
a camera module electrically connected to the processing unit and positioned on the display;
wherein the microphone module transmits the voice signal to the voice encoding module, and one of the voice encoding module and the processing unit analyzes and processes the voice signal to determine a sound source direction of the voice signal and obtains response information according to the voice signal;
wherein the processing unit controls the display to rotate to the sound source direction and transmits the response information to the display for displaying the response information;
wherein the processing unit controls the display to rotate to the sound source direction and activates the camera module to capture an image after the display is rotated to the sound source direction,
wherein the processing unit determines whether a face feature is in the image and adjusts a tilting angle of the display according to a location of the face feature in the image captured by the camera and transmits the response information to the display for displaying the response information.

24. The voice control system of claim 23, further comprising at least one remote electronic device, wherein when the voice encoding module or the processing unit determines that the voice signal is a control instruction, the voice control device transmits the control instruction to the at least one remote electronic device.

* * * * *